(12) United States Patent
Craven et al.

(10) Patent No.: US 8,533,571 B2
(45) Date of Patent: Sep. 10, 2013

(54) LOSSY CODING OF SIGNALS

(76) Inventors: Peter Graham Craven, London (GB);
Malcolm Law, West Sussex (GB)

( * ) Notice: Subject to any disclaimer, the term of this patent is extended or adjusted under 35 U.S.C. 154(b) by 173 days.

(21) Appl. No.: 13/122,202

(22) PCT Filed: Sep. 11, 2009

(86) PCT No.: PCT/GB2009/002185
§ 371 (c)(1),
(2), (4) Date: Apr. 1, 2011

(87) PCT Pub. No.: WO2010/038000
PCT Pub. Date: Apr. 8, 2010

(65) Prior Publication Data
US 2011/0179338 A1 Jul. 21, 2011

(30) Foreign Application Priority Data
Oct. 1, 2008 (GB) .................................... 0817977.2

(51) Int. Cl.
*G11C 29/00* (2006.01)
(52) U.S. Cl.
USPC ............................ 714/772; 704/229; 704/500
(58) Field of Classification Search
USPC .................................. 714/772; 704/229, 500
See application file for complete search history.

(56) References Cited

U.S. PATENT DOCUMENTS 5,444,490 A   8/1995   de With et al.
7,272,567 B2  9/2007   Fejzo 2005/0246178 A1* 11/2005 Fejzo ............................ 704/500
2007/0276889 A1* 11/2007 Gayer et al. .................. 708/200
2011/0224991 A1*  9/2011 Fejzo ............................ 704/500

FOREIGN PATENT DOCUMENTS

| EP | 1 176 743 A2 | 1/2002 |
| GB | 2 360 915 A | 10/2001 |
| GB | 2463974 B | 2/2011 |
| KR | 20020073961 A | 3/2001 |

OTHER PUBLICATIONS

Redmill, D.W. and Kingsbury, N.G., "The EREC: an error-resilient technique for coding variable-lengthblocks of data", IEEE Transactions on Image Processing, Apr. 1996, vol. 5, Issue 4, ISSN: 1057-7149, INSPEC Accession No. 5266218, (cover pp. 1-4 + pp. 565-574, total 14 pages).

Yong Fang and Lu Yu, "Block-Interleaved Error-Resilient Entropy Coding", IEEE International Symposium on Circuits and Systems, 2007, May 27-30, 2007, ISBN: 1-4244-0920-9, Inspec Accession No. 9538892, (cover p. 1 + pp. 53-56, total 5 pages).

Han Seung Jung et al., "A Hierarchical Synchronization Technique Based on the EREC for Robust Transmission of H.263 Bit Stream", IEEE Transactions on Circuits and Systems for Video Technology, vol. 10, No. 3, Apr. 1, 2000, XP011014048, ISSN: 1051-8215, (pp. 433438, total 6 pages).

(Continued)

*Primary Examiner* — Sam Rizk
(74) *Attorney, Agent, or Firm* — Buckley, Maschoff & Talwalkar LLC

(57) ABSTRACT

A method is described for packing variable-length entropy coded data into a fixed rate data stream along with resolution enhancement data, the method providing tightly constrained propagation of transmission channel errors and graceful degradation of signal resolution as entropy-coded data rate increases. An application to a multiband ADPCM audio codec is also described.

31 Claims, 15 Drawing Sheets

(56) References Cited

OTHER PUBLICATIONS

Ralph Sperschneider, "Error Resilient Source Coding with Variable Length Codes and its Application to MPEG Advanced Audio Coding", AES Audio Engineering Society 109th Convention, Sep. 22-25, 2000, XP-002564900, 19pgs.

T. Aladrovic et al., "An Error Resilience Scheme for Layered Video Coding", Industrial Electronics, 2005, ISIE 2005, Proceedings of the IEEE International Symposium on Dubrovnik, Croatia, Jun. 20-23, 2005, Piscataway, NJ, USA, IEEE, vol. 3, Jun. 20, 2005, XP010850271, ISBN: 978-0/7803-8738-6, (pp. 1285-1290, total 3pgs.).

Qian Zhang et al., "Resource Allocation for Multimedia Streaming Over the Internet", IEEE Transactions on Multimedia, vol. 3, No., 3 Sep. 3, 2001, XP-002564901, (pp. 339-355, total 17 pages).

Angela Doufexi et al., "MPEG-2 Video Transmission Using the HIPERLAN/2 WLAN Standard", International Conference on Consumer Electornics, 2001 Digest of Technical Papers, ICCE, Los Angeles, CA, Jun. 19-21, 2001, IEEE, XP010552065, ISBN: 978-0/7803-6622-0, (pp. 55-53, total 2 pages).

Michael A. Gerzon et al., "A High-Rate Buried-Data Channel for Audio CD", Journal of the Audio Engineering Society, Audio Engineering Society, New York, NY, US, vol. 43, No. 1/02, Jan. 1, 1995, XP000733672, ISSN: 1549-4950, (pp. 3-22, total 20 pages).

Patents Act 1977: Search Report under Section 17(5), dated Jul. 31, 2009 for GB Application No. GB08179772.2, 4pgs.

"Patents Act 1977: Combined Search and Examination Report under Sections 17 and 18(3)", dated Jan. 11, 2010 for GB Application No. GB0916011.0, 6pgs.

Patent Cooperation Treaty, "PCT International Search Report and Written Opinion of the International Search Authority", dated Jul. 14, 2010 for PCT/GB2009/002185, 25pgs.

* cited by examiner

Direction of movement

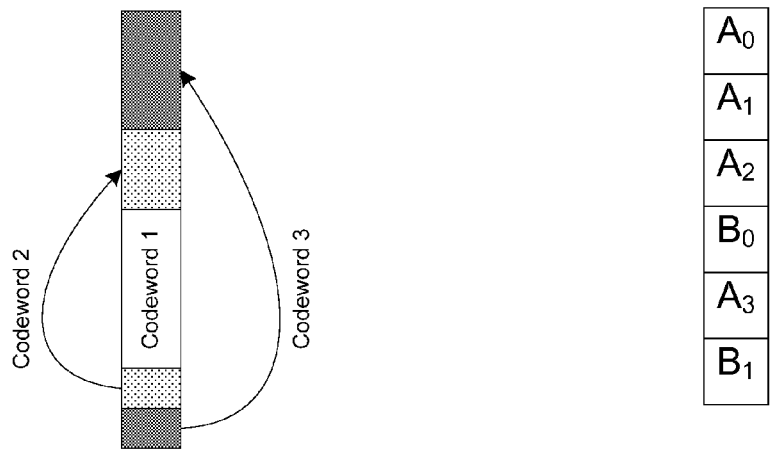
FIG. 19                              FIG. 20
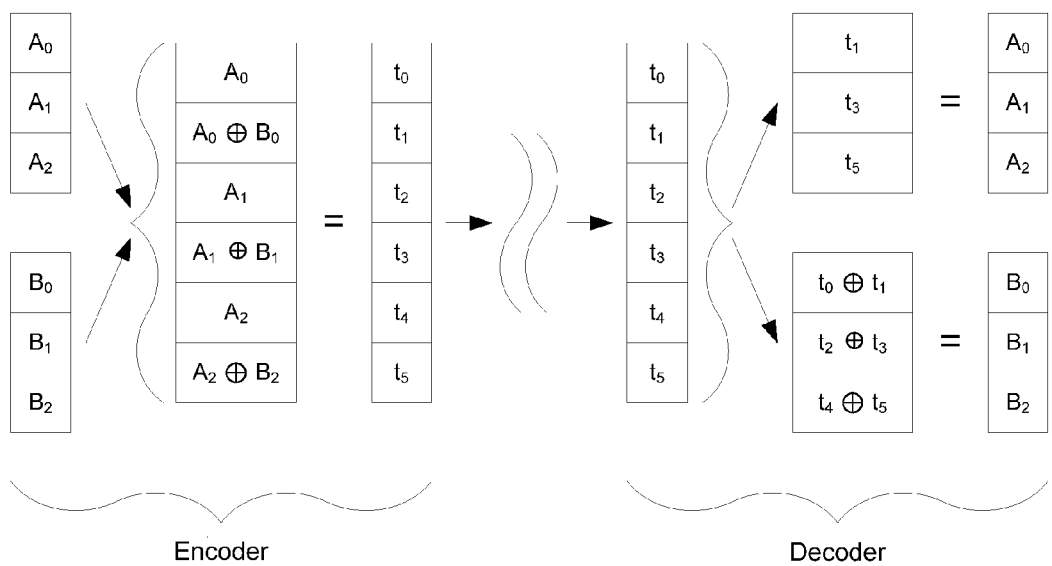
FIG. 21

LOSSY CODING OF SIGNALS

CROSS-REFERENCE TO RELATED APPLICATION

This application is a U.S. National Stage filing under 35 U.S.C. §371 and 35 U.S.C. §119, based on and claiming priority to PCT/GB/2009/002185 for "IMPROVED LOSSY CODING OF SIGNALS" filed Sep. 11, 2009, claiming benefit of and priority to GB Patent Application No. 0817977.2 filed Oct. 1, 2008.

FIELD OF THE INVENTION

The invention relates to an improved method for the lossy coding of signals, and particularly to packing variable-length entropy coded data into a fixed rate data stream along with resolution enhancement data.

BACKGROUND TO THE INVENTION

Samples of typical audio and video signals do not have a rectangular PDF (Probability Density Function) and for these data the efficiency advantage of entropy coding is well known. Quantisation followed by entropy coding allows commonly occurring small sample values to be encoded to a small number of bits, while infrequently occurring large sample values can take a larger number of bits. With correct design, the total number of bits in the coded signal is less than with straightforward binary or PCM (Pulse Code Modulation) coding of the quantised signal values.

Entropy coding however incurs some practical disadvantages. Firstly, the stream of coded data potentially has a variable data rate, which can be a considerable inconvenience for transmission over a fixed rate channel. Secondly, there is the likelihood of increased sensitivity to bit errors, because a single bit-error can propagate and thereby corrupt several samples.

The propagation of bit-errors arises because it is normal to pack the varying-length coded samples or codewords contiguously together. It is normal to code each sample using a prefix code, which has the property that a decoder can deduce from the initial segment of a codeword whether more bits follow or not. Once the start of the first codeword has been identified, a decoder can thus determine the end of that codeword. With contiguous packing, the next codeword follows immediately and an indefinite number of varying-length codewords can be correctly decoded. However, as single bit error may cause the end of a codeword to be incorrectly determined, and all subsequent codewords may be incorrectly decoded until the process is restarted at a known position within the stream.

Many schemes have been designed to ameliorate this problem. For example, the original signal may be divided into blocks each containing a constant number of samples, the output data format being similarly divided into blocks of constant size, each output block containing the entropy-coded data for one input block. Decoding then starts afresh for each block and an error can corrupt at most one block of data. The constant output block size must be chosen large enough to hold the largest amount of coded data from any input block, so there is wastage in the case of blocks that code to smaller amounts of data. Known improvements to and variations of simple block coding include allocating the coded data from each end of an output block, and incorporating pointers to intermediate positions within the block.

A very significant contribution to the field was "Error Resilient Entropy Coding" (EREC), as described in D. W. Redmill and N. G. Kingsbury, "The EREC: An error resilient technique for coding variable-length blocks of data", IEEE Trans. on Image Processing, vol. 5, pp. 565-574, April 1996. EREC considers the output block as consisting of "slots" into which bits may be placed. In one embodiment of EREC, there is the same number of slots as there are codewords, and allocation of codewords to slots proceeds in a series of stages. At the first stage, there is one slot allocated to each codeword and the bits from the codeword are placed in its allocated slot if possible. In general some slots may not be completely filled after the first stage, and there may also be some slots whose allocated codewords are too large, so that some codeword bits must remain unplaced. In the second stage, a different allocation of slots to codewords is used, and for each codeword, an attempt is made to place remaining bits from the codeword into any vacant space in its newly-allocated slot. Further stages of allocation are then applied until all codeword bits have been placed.

An important feature of EREC is that the allocation of slots to codewords that is used at each stage is pre-determined: it does not depend on the lengths of the codewords. Therefore, bits that are placed in the first stage of the algorithm are in fixed locations: a decoder can look for these bits in the correct place regardless of any corruption of other bits during transmission. Bits that are placed in the second stage are slightly more vulnerable: the decoder may misjudge the starting position of those bits within their slot if there was an error in the bits that were placed in that slot during the first stage.

It will be clear that the error resilience given by EREC will be greatest for those bits that are placed at an early stage. The proportion of bits placed at an early stage can be increased by ensuring that the total capacity of the slots is significantly greater than the total number of bits in the codewords. However, to do so clearly results in wastage as there will be vacant space remaining in at least some of the slots at the end of the process.

If quantisation and coding are considered together, it is usually possible to adjust this total number of codeword bits by altering the quantisation resolution (step size or scale factor). However the optimal resolution, i.e. the resolution that results in codeword bits that exactly fill the output block, will generally not be known a priori, being dependent on the complexity of the information in the signal block. An initial trial encoding followed by adjustment of resolution is therefore required if the number of codeword bits is to be matched accurately to the size of an output block. Such an iterative approach is computationally expensive and may be impractical, in which case a margin must be allowed between the expected number of codeword bits and the size of the output block, generally resulting in wastage.

A further consideration is that a requirement to consider the data as consisting of blocks of significant size may be unduly restrictive. For example an audio signal has no natural block structure: coding such data as blocks necessarily incurs delay, which may be unacceptable in some critical applications. The EREC system as described in OD. W. Redmill and N. G. Kingsbury, "The EREC: An error resilient technique for coding variable-length blocks of data", IEEE Trans. on Image Processing, vol. 5, pp. 565-574, April 1996 is adapted to the coding of video signals, and it takes advantage of the video block (or frame) structure. This system could therefore be considered unsuitable for use in audio applications in which delay is critical.

Hence there is a requirement for an efficient method of packing variable length signal data that is resilient to errors, that avoids wastage and that is configurable to situations in which delay must be minimised.

SUMMARY OF THE INVENTION

According to a first aspect of the present invention, a sequence of signal samples is encoded to furnish a sequence of composite codewords containing bits, by the method of:
maintaining a conveyor comprising a sequence of slots, including a start slot and an end slot, wherein each slot is adapted to contain one or more bits and wherein the conveyor is adapted to effectively move the bit content of each slot to an adjacent slot after the passage of a time step, whereby bits are conveyed from earlier slots to later slots with the passage of each subsequent time step; and, for each signal sample performing the steps of:
representing the signal sample by a coarse codeword and a touchup codeword, each of the coarse codeword and touchup codeword containing bits;
distributing the bits of the coarse codeword into slots in the conveyor;
retrieving a delayed codeword from the end slot; and,
combining the touchup codeword with the delayed codeword to furnish a composite codeword.

The coarse codeword will typically have a signal-dependent length, and the step of distributing allows information contained in an unusually long coarse codeword to be accommodated in composite codewords of possibly shorter length. Combining the touchup data allows increased signal resolution when the coarse data is not occupying the full width of the composite codewords.

In some embodiments, the signal is provided as, or can be represented by, a sequence of PCM binary words, the signal being quantised if necessary. The invention may then entropy code the MSBs of each PCM word to provide the coarse codewords, while information from the LSBs of the PCM words provides resolution enhancement via the touchup codewords of the invention.

In some embodiments, for example if the signal samples are vector-valued, a more general type of quantiser may be needed, furnishing a more general symbol plus fine resolution-enhancement data. The symbols are then coded using a variable-length coding method for efficiency.

It is preferred that step of quantising furnishes a sign bit as well as a symbol and fine bits, the sign bit then being incorporated into the touchup codeword. This allows an efficiency improvement as will be explained. In the case of a vector-valued signal, it may be advantageous for the quantiser to furnish a plurality of sign bits, up to the number of components of the vector.

Several methods of distributing the bits of a coarse codeword between slots of the conveyor can be used to reduce the variation in the number of bits between slots, and in particular the variation in the number of bits in the delayed codeword that is retrieved from the end slot as successive samples are processed. The skilled person will realise that the same final result can sometimes be obtained either by initially placing all the bits of coarse codeword in the first slot of the conveyor and by moving some bits subsequently, or by distributing codeword bits among several conveyor slots at the time of placement or by retrieving bits from several conveyor slots at the time of retrieval. Here we consider the final allocation of bits to the delayed codeword to be important and are not intending a description of the precise method of how that allocation of bits is to be achieved to be restrictive.

According to one preferred method, a bit is moved from an earlier slot within the conveyor to a later slot containing at least two fewer bits, assuming that such a later slot exists. However, for reasons of propagation of transmission errors it is desirable not to move bits unnecessarily and in a preferred embodiment a bit is not moved unless the slot that it occupies contains more than a predetermined number of bits.

It is also desirable to minimise the distance a bit is moved from its natural position and so another preferred embodiment places a bit from the coarse codeword into the first slot containing fewer than a predetermined number of bits. Alternatively, the bit may be placed into the first of the slots that contain the smallest number of bits. Conversely, if there is danger that the conveyor may be come over-full, it may be preferred to place the bit into last of the slots that contain the smallest number of bits.

It is assumed that the signal cannot be properly reproduced by a decoder unless all the coarse bits are conveyed to the decoder. Hence it is preferred that in the step of combining, preference is given to the coarse bits, for example by firstly copying the coarse bits retrieved from the conveyor to the composite codeword, and then copying fine or touchup bits into those bit positions that remain unfilled. According to the invention, each touchup bit is associated with a unique bit position in the composite codeword. Either the touchup bit is copied to that unique position, or it is not copied.

If some touchup bits are not copied to the composite codeword, signal resolution will be lost. This loss can however be mitigated by suitably adjusting the signal before any quantisation or division into coarse and fine codewords. It is therefore preferred that the step of representing be performed in dependence on the number of bits in the delayed codeword retrieved from the conveyor. It is still more preferable that the step should comprise quantising in dependence on the values of the bits in the delayed codeword. In some embodiments, this is achieved by deriving an arithmetic value in dependence on the values of the bits in the delayed codeword and then subtracting the arithmetic value from the signal sample, before quantising the signal sample.

A signal may be either a scalar signal or a vector-valued signal: the invention can be configured to process vector-valued signals in several ways. In some embodiments, the step of quantising a vector valued signal yields a single symbol and a plurality of fine codewords. The single symbol can then be coded to produce a single coarse codeword. In other embodiments, a vector-valued sample is considered to comprise several scalar components which are quantised separately to produce several symbols and several fine codewords. The several symbols can then be coded jointly so the result is a single coarse codeword as before. Alternatively, the several symbols can be coded separately, and the bits of the resulting coarse codewords merged to form a combined coarse codeword. If the merging were done by simple concatenation, then because of the variable-length property, a transmission error affecting a bit of the first codeword would potentially invalidate the decoding of all of them. It is preferred therefore that the bits should be interleaved so that each codeword has at least one bit in a predetermined position within the combined codeword.

If the signal sample is vector valued, there will usually be several fine codewords that for convenience need to be merged into a single combined touchup codeword, which can then be treated in the same way as a fine codeword or a touchup codeword that results when the invention is applied to a scalar signal sample. In some embodiments, the merging is done by interleaving the bits of the individual fine codewords. However, if a scalar component of a vector valued sample requires higher resolution than the other components, it is preferred to place the fine bits relating to that components in bit positions within the combined touchup word that are most likely to be copied to the final composite codeword, that is that are least likely to be pre-empted by coarse bits.

Another consideration is that if bits from fine codewords are simply interleaved, then one of those bits will be in a position that is most likely to be pre-empted by a coarse bit. Naively, that will cause a sudden loss of 6 dB of signal resolution in the component associated with that bit. This implies an imbalance between the resolution given to different components, which can be reduced by forming a bit of the combined touchup codeword by as an exclusive-OR combination of a bit from each of two of the fine codewords.

With some ADPCM compression architectures it is hard to provide a compressed data rate that is not an integer multiple of a signal sample rate, without favouring the resolution given to some samples relative to others. According to the invention, dummy or void bits can be introduced into the conveyor, typically into the first slot before any bits from codewords have been placed. Because of the possibility to distribute codeword bits between slots, the presence of the void bit does not selectively disadvantage the codeword that is then placed, relative to its immediate neighbours, at least not to any great extent. When the void bit reaches the last slot of the conveyor, it is recognised as such. Conceptually the void bit is copied to the composite codeword as if it were a normal coarse bit, and then after the composite codeword has been formed the void bit is deleted, thus shortening the composite codeword. The skilled person will see that this process can be optimised and some of the copying skipped. Again the concept of a "void bit" may not be implemented literally, the method instead keeping track of the fact that some of the slots, also known as columns, of the conveyor have different heights from others. What is important is that final effect is that a shorter composite codeword is obtained.

If this is done repeatedly, preferably according to a predetermined pattern that is also known to a decoding method, then a data rate that is a rational but non-integer multiple of the sampling frequency may be conveniently obtained. The skilled person will also be aware that some or all void bits could be replaced by bits carrying other information. The final data rate will not then be reduced in respect of these bits, but again if the replacement is done according to a predetermined pattern that is known to a decoding method, then a low rate auxiliary data channel can conveniently be embedded in a transmitted compressed data stream.

According to a second aspect of the present invention, a sequence of composite codewords containing bits is decoded to furnish a sequence of signal samples by the steps of:
  placing bits from the composite codeword into a LIFO (last in first out) stack;
  placing bits from a replica of the composite codeword into a delay unit;
  retrieving first bits from the LIFO stack, the number of first bits retrieved being determined in dependence on the values of those bits already retrieved;
  retrieving delayed bits from the delay unit;
  jointly decoding the first bits and the delayed bits to furnish a signal sample.

As will be explained, the LIFO stack allows coarse bits encoded using one of the conveyor-based methods to be retrieved in the correct order. The retrieval of coarse bits from the stack may be closely bound with an entropy decoding method, as will also be explained. The portions of composite codewords that are placed into the stack will usually also contain touchup bits. These are not retrieved by the entropy decoding method but can be removed by a timeout mechanism.

Depending on the details of the encoding method that produced the composite codeword, resolution of the decoded signal samples should preferably by optimised by decoding the first bits to furnish a first arithmetic value, deriving a second arithmetic value from the delayed bits, and adding the first arithmetic value to the second arithmetic value. Here the first arithmetic value will furnish a coarse approximation to the signal sample while the second provides resolution enhancement.

However, in a preferred embodiment, the first arithmetic value is conditionally negated the condition being determined in dependence on a delayed bit. This allows more efficient encoding, as will be explained.

It is further preferred that the step of deriving comprises performing an exclusive-OR operation between a first delayed bit and a second delayed bit. This inverts an exclusive-OR operation that may have been performed in an encoding method, with advantages as recited in relation to the first aspect of the invention.

According to a third aspect of the present invention, there is provided an encoder adapted to encode a signal according to the method of the first aspect.

According to a fourth aspect of the present invention, there is provided a decoder adapted to decode a signal according to the method of the second aspect.

According to a fifth aspect of the present invention, a data carrier comprises an audio signal encoded using the method of the first aspect.

According to a sixth aspect of the invention, a signal is encoded to a formatted binary representation by the steps of:
  deriving from the signal a first set and a second set of codewords, referred to as "coarse codewords" and "touchup codewords" respectively, each codeword comprising bits;
  establishing, in relation to each touchup codeword, a set of predetermined touchup bit positions within the formatted binary representation, the touchup bit positions being predetermined independently of the length of any codeword or of data contained within any codeword;
  unconditionally placing the bits of a coarse codeword into the formatted binary representation; and,
  conditionally placing a bit from a touchup codeword into the predetermined touchup bit position that was established in relation to that touchup codeword, wherein:
  the coarse codewords have a signal-dependent length; and,
  the placement of each bit from a touchup codeword into its respective predetermined touchup bit position is conditional on that position not being occupied by a bit from a coarse codeword.

Thus, coarse codewords are of variable length, as typically provided by an entropy coder. All the bits of each coarse codeword ("coarse bits") are placed into the binary representation, their positions in general being data-dependent, so that the position of a bit of a coarse codeword may depend on the lengths of other coarse codewords. In contrast, each bit from each touchup codeword is either placed or not placed: if it is placed, then it is placed in a position that has been predetermined.

In typical operation the method will place some of the coarse bits in positions that have been predetermined as touchup bit positions, thereby preventing some of the bits from touchup codewords from being placed. We say that these unplaced bits have been pre-empted by the coarse bits so placed. This ability to pre-empt provides flexibility to accommodate coarse codewords that are longer than usual. Likewise, it allows the proportion of the formatted representation occupied by coarse and touchup bits to vary dynamically in response to signal, without the overhead of determining and enforcing a boundary between bit positions allocated to coarse codewords and bit positions allocated to fine codewords, and possibly communicating such a boundary to a decoder, as might be the case in prior art systems such as are described in U.S. Pat. No. 7,272,567 (Fejzo).

Preferably, the touchup bit positions are predetermined without any direct dependence on the length of any codeword or on data contained within any codeword. A step of establishing is typically performed before the encoding starts, perhaps in response to configuration data, or alternatively as part of a step of designing a format specification. It is not excluded that the step of establishing may be repeated from time to time in dependence on the statistics of the signal, but in this case it will be necessary, if the binary representation is to be transmitted and decoded, for revised format information to be transmitted as reconfiguration data along with the signal data itself. Preferably, the touchup bit positions relating to distinct touchup codewords to not overlap.

In an embodiment in which the signal contains samples, it is preferred that:
  each coarse codeword is derived from a group of one or more of the signal samples, the groups being disjoint;
  for each such coarse codeword there is a corresponding touchup codeword that is derived from the same group of samples; and,
  a bit from a coarse codeword is placed in a predetermined touchup bit position that has been established in relation to a touchup word that does not correspond to the coarse codeword.

Thus, if the group of signal samples has characteristics that cause its corresponding coarse codeword to be larger than other coarse codewords, the bits from the coarse codeword are not restricted to parts of the binary representation that would normally be allocated to that codeword or to a touchup codeword relating to the same group of samples, but can overflow to parts that would normally be occupied by touchup bits that relate to other groups of samples. This allows the allowed maximum size of a coarse codeword to be much larger than the normal size, even in a streaming application having a fixed and constrained data rate. It thus allows isolated features in an otherwise featureless video image to be transmitted without compromise, and similarly for transients in an audio application.

It is preferred that no bit from any coarse codeword is placed in a touchup bit position that has been established in relation to a touchup word that corresponds to the coarse codeword. In the step of deriving, information representing the signal is divided into coarse and touchup codewords. This division is generally performed independently on portions of the signal, where for example in the case of a sampled signal, a portion could be a sample or a group of samples. If coarse codeword bits from a portion were placed in touchup bit positions that relate to the same portion, there would be a potential circularity that might be difficult to handle.

In embodiments in which the codewords are ordered in time, it is further preferred that no bit from any coarse codeword is placed in a touchup bit position that has been established in relation to a touchup word that corresponds to a previous coarse codeword. Thus, when the previous coarse codeword and its corresponding touchup codeword are generated, it is known that no coarse bits from later codewords will be placed in the touchup bit positions that relate to the previous codeword. Thus deterministic sequential encoding is possible, the previous codewords being generated with certainty concerning which bits from the touchup codeword can be placed in the compressed data.

Preferably, in the unconditional placement step, at least one bit from each coarse codeword is placed in a predetermined position. This provides robustness to transmission channel errors as has been explained in the "Background" section in relation to the EREC placement method.

Preferably, in the unconditional placement step, a bit from a first coarse codeword is placed at a position that is dependent on the length of a second coarse codeword. Although, as stated above, it may be preferred that at least one bit from each coarse codeword be placed at a predetermined position and hence independently of other codewords, flexibility to displace other bits of a codeword in response to the size of other coarse codewords is also desirable if variations in codeword size are to be optimally accommodated.

In some embodiments, the bits of the coarse codewords are placed according to a method known as Error Resilient Entropy Coding (or EREC).

In some embodiments, the formatted binary representation consists of a stream of data bits having an externally prescribed data rate. The invention allows the coarse and fine codewords to be packed so that the total data rate is constant, even though the coarse codewords are of varying size.

In some embodiments, the signal comprises samples ordered in time and the time delay before which an encoded signal can be decoded does not exceed n sample periods, where preferably n=32, more preferably n=20, still more preferably n=12, and most preferably n=8. Using a 'conveyor' organisation as described later, or otherwise, the steps of the method can be implemented by considering only coded samples lying in a short window that moves steadily along a conceptually infinite stream of coded samples, the method thereby incurring a processing delay corresponding to the length of the window. This allows low-delay codecs to be constructed, for example in low-delay audio applications where it may be desired to restrict delay to perhaps one to three milliseconds.

Whilst advantageous for delay purposes, there are disadvantages to using a short conveyor so the optimal length will be application specific. The impact of a transient feature in the signal, transiently causing large codewords, is only spread over the window length. Thus, a short window gives less buffering capacity for transient features, and makes the loss of resolution for any particular transient shorter but more severe.

Preferably, the step of deriving further comprises the step of quantising portions of the signal, the codewords being derived in dependence on the quantised signal portions, and the quantising being performed in dependence on the values of any bits from coarse codewords that have been placed in touchup bit positions corresponding to a touchup codeword that will be derived in dependence on the step of quantising.

This preferred dependence relates to the convenience and quality of subsequent decoding. A decoder may retrieve a touchup codeword from the predetermined bit positions relating to that codeword, without considering whether those bit positions are in fact occupied by coarse bits. If they are so occupied, the decoding will thereby be perturbed. However, if the quantisation is performed in dependence on the values of any such coarse bits, the perturbation can be compensated and indeed with suitable precautions used as a source of subtractive dither. Thus, it is preferred that quantising be performed in dependence on the values of any coarse bits that may pre-empt touchup bits that result from the quantising.

Although it might be natural to say that, on being informed that the LSBs of its output word will be pre-empted and hence discarded, a quantiser will quantise to a shorter wordlength, we shall not adopt that mode of description. Instead, we shall consider that the quantisation step furnishes a touchup codeword having a length that is independent of the signal or of knowledge of pre-emption, so that a bit in a given position within the touchup word retains its meaning and significance when a touchup bit is pre-empted.

In many embodiments the bits within a touchup codeword have differing significance, and it is preferred that bits from the coarse codewords are preferentially placed in positions other than predetermined touchup bit positions that, if not occupied by a bit from a coarse codeword, would be used to place touchup bits of high significance. Thus, if touchup bits are to be pre-empted by coarse bits, it is the touchup bits of lower significance that are preferentially pre-empted, in order to minimise the consequent loss of signal resolution.

In some embodiments, the coarse codewords contain information whereby a decoder may furnish an approximation to the signal using information from the coarse codewords only. Thus, even if all or nearly all touchup bits are pre-empted by coarse bits, approximate decoding is still possible. In this case it is appropriate to refer to the touchup bits as "fine bits". In some embodiments of this type, the fine bits may be the LSBs (least significant bits) of a binary word representing the result of a quantisation, while the coarse bits are derived from the MSBs (most significant bits) of that quantisation.

In some embodiments wherein the signal comprises samples, it is preferred that the coarse codewords contain information whereby a decoder may furnish an approximation to the signal samples using only information from the coarse codewords together with information relating to the signs of the signal samples. While one might think of a "sign bit" of a PCM binary word as being the most significant bit of all and so might expect to classify it as a coarse bit, it may be advantageous instead to arrange that sign information is distributed between the coarse bits and a touchup bit. In this case the encoding of the coarse bits must be performed in dependence on knowledge of whether the touchup bit has been placed or whether it has been pre-empted.

According to a seventh aspect of the invention, formatted binary data representing a signal is decoded by the steps of:
  retrieving from the data a first set of codewords containing bits, referred to as "coarse codewords";
  retrieving from the data a second set of codewords containing bits, referred to as "touchup codewords"; and,
  combining the coarse codewords and the touchup codewords to furnish an output signal,
  wherein the length of a coarse codeword is determined in dependence on the values of bits in the codeword,
  wherein the step of retrieving a touchup codeword comprises the steps of:
    establishing, in relation to each bit of the touchup codeword, a predetermined touchup bit position within the formatted binary data, the touchup bit position having been predetermined independently of the length of any retrieved coarse codeword or of data contained within any retrieved coarse codeword; and,
    conditionally retrieving each bit of the touchup codeword from its predetermined touchup bit position,
  and wherein a bit of a coarse codeword is retrieved from a bit position that is also a predetermined bit position established in relation to a bit of a touchup codeword.

The features of the invention in its seventh aspect are intended to complement those of the invention in its sixth aspect. A step of establishing will be typically be performed before decoding starts, and may be repeated in dependence on reconfiguration data that may be received from time to time.

Preferably, at least one bit from each coarse codeword is retrieved from a predetermined position within the data. This avoids propagation of errors.

Preferably, a bit of a first coarse codeword is retrieved from a position within the data that is determined in dependence on the length of a second coarse codeword. This provides flexibility to accommodate variations in codeword size.

In some embodiments of the seventh aspect, in the sub-step of conditionally retrieving a bit of a touchup codeword, the condition is true if no bit from a coarse codeword has been retrieved from the bit position that has been established as the predetermined bit position relating to the bit of the touchup codeword. This ensures that coarse bits are not interpreted as touchup bits.

In some embodiments of the seventh aspect, in the step of conditionally retrieving a bit of a touchup codeword, the condition is always true. In such embodiments, some coarse bits are interpreted as touchup bits. These embodiments are suitable to decode data that has been quantised in dependence on information about which touchup bits have been pre-empted.

In some embodiments of the seventh aspect the step of combining a touchup codeword is performed independently of whether any bit from a coarse codeword has been retrieved from a bit position that has been established as the predetermined bit position relating to the bit of the touchup codeword. Again, this simplification is possible without compromising the resolution of the decoded signal if the signal data has been quantised in dependence on knowledge of any pre-emption of touchup bits.

According to an eighth aspect of the present invention, there is provided an encoder adapted to encode a signal according to the method of the sixth aspect. Preferably, the encoder is an Adaptive Differential Pulse Code Modulation (ADPCM) encoder.

According to an ninth aspect of the present invention, there is provided a decoder adapted to decode a signal according to the method of the seventh aspect. Preferably, the encoder is an Adaptive Differential Pulse Code Modulation (ADPCM) encoder.

According to an tenth aspect of the present invention, a codec comprises an encoder according to the sixth aspect in combination with a decoder according to the seventh aspect. Preferably, the codec is a multiband codec.

According to an eleventh aspect of the present invention, a data carrier comprises an audio signal encoded using the method of the sixth aspect.

According to a twelfth aspect of the invention, a sequence of input codewords of varying length is processed to furnish a sequence of compactified codewords, by the method of:
  maintaining a conveyor comprising a sequence of slots, including a start slot and an end slot, wherein each slot is adapted to contain one or more bits and wherein the conveyor is adapted to effectively move the bit content of each slot to an adjacent slot after the passage of a time step, whereby bits are conveyed from earlier slots to later slots with the passage of each subsequent time step; and,
  for each input codeword performing the steps of:
  placing the input codeword into the start slot;
  moving a bit from an earlier slot within the conveyor to a later slot having at least two fewer bits; and
  retrieving a compactified codeword from the end slot.

Substantially, the compactified codewords will normally mimic the input codewords, but the step of moving allows information contained in a longer input codeword to be moved to a compactified codeword corresponding to an earlier input codeword of shorter length, if such exists. This reduces the variability of length and if possible also reduces the maximum length of the compactified codewords.

In some embodiments, the step of moving is performed conditionally on the earlier slot having more than a predetermined number of bits. This is advantageous if it is desired to restrict the movement to situations in which it would assist in reducing the maximum length of the compactified codewords.

As explained previously, optimisations of the method that will be apparent to a person skilled in the art are not excluded, and a step of moving may be elided with a step of placing a bit from an input codeword into the start slot.

According to a thirteenth aspect of the present invention, a method of inverse quantising comprises the steps of:
receiving a symbol from a set of at least three possible symbols and an associated sign bit;
when the sign bit is '+1', mapping the received symbol to a reconstruction level by a first function L1;
when the sign bit is '−1', mapping the received symbol to a reconstruction level by a second function L2; and,
deriving a sample value in dependence on the reconstructed level,
wherein the functions L2 and L1 are such that for any received symbol s, except the two for which L1(s) is minimum or maximum, the negated reconstruction level −L2(s) lies between the two reconstruction levels mapped by L1 that neighbour L1(s).

The invention in this thirteenth aspect is intended for use with a quantiser that may or may not have free choice over the sign bit. With either choice of sign bit, the reconstruction levels provided by L1 and L2 individually cover a full range of sample values, both positive and negative. The property that −L2(s) lies between the neighbours of L1(s) ensures that when the sign bit can be freely chosen, the symbol s can represent both positive and negative values of similar absolute magnitude, which allows efficient entropy coding if the probability density function of the sample values is symmetrical about zero.

In the case that the inverse decoder decodes the symbol to a vector valued sample, the functions L1 and L2 are to be understood as the restriction to decoding a single dimension.

Preferably, for any received symbol s the reconstruction level L1[s] should be substantially equal to −L2[s].

Preferably, the ranges of the functions L1 and L2 should interleave such that between any two distinct reconstruction levels of L1 there is a reconstruction level of L2, and between any two distinct reconstruction levels of L2 there is a reconstruction level of L1. This ensures that a free choice of sign will always result in a smaller interval between available reconstruction levels than when the sign is forced.

In some embodiments the reconstruction levels in the union of the first and second sets are equally spaced, permitting straightforward uniform quantisation. In other embodiments, the reconstruction levels in the union of the first and second sets are unequally spaced, providing more efficient coding when lower resolution is acceptable for larger sample values.

It is preferred that the step of deriving should comprise adding a dither value to the selected reconstruction level. This provides for a reconstruction that is the most linear and has the least noise, according to the method of subtractive dither.

It is preferred that the method further comprise the step of receiving some fine bits and that the dither value be determined in dependence on those fine bits. This provides for the possibility of resolution enhancement if an encoder has free choice of the values of the fine bits.

In some embodiments the dither value is determined in dependence on the symbol s. For example, scaling of a dither value according to the interval between consecutive reconstruction levels is required for the optimal operation of subtractive dither, if the reconstruction levels are unequally spaced.

According to a fourteenth aspect of the present invention, there is provided a method of quantising a signal sample in dependence on whether a sign bit is forced, the method comprising the steps of:
establishing a first function L1 and a second function L2 from a set of at least three symbols to reconstruction levels;
if the sign bit is forced to '+1', selecting a reconstruction level L1[s] from the range of the first function L1;
if the sign bit is forced to selecting a reconstruction level L2[s] from the range of the second function L2;
if the sign bit is not forced, selecting a reconstruction level from the union of the ranges of both the first and second functions;
furnishing a symbol s such that the relevant function maps to the selected reconstruction level; and,
if the sign bit was not forced, furnishing a sign bit selected from '+1' or '−1' according to whether the selected reconstruction level was in the range of the first or the second function,
wherein the functions L2 and L1 are such that for any received symbol s, except the two for which L1(s) is minimum or maximum, the negated reconstruction level −L2(s) lies between the two reconstruction levels mapped by L1 that neighbour L1(s).

The reconstruction levels should be compatible with the levels used by a decoding method according to the thirteenth aspect, and the same criteria apply, as already enumerated in respect of the decoding method.

Preferably the step of selecting a reconstruction level comprises choosing the reconstruction level that is closest to the signal sample, in order that the error introduced by encoding and decoding should be as small as possible.

Preferably, the step of establishing should comprise modifying the levels of a set of predetermined reconstruction levels in dependence on a dither value, in order to minimise nonlinear distortion caused by quantisation.

Preferably, a corresponding decoding method should determine its dither value in dependence on received fine bits, and the encoding method should furnish fine bits that may be transmitted to such a decoding method, the encoder choosing the fine bits so as to minimise the error introduced by the combination of encoding and decoding.

According to a fifteenth aspect of the present invention, there is provided an encoder adapted to encode a signal according to the method of the fourteenth aspect.

According to a sixteenth aspect of the present invention, there is provided a decoder adapted to decode a signal according to the method of the thirteenth aspect.

According to a seventeenth aspect of the present invention, a data carrier comprises an audio signal encoded using the method of the fourteenth aspect.

As will be appreciated by those skilled in the art the present invention provides a number of techniques for improved coding with a wide range of different embellishments. Further variations will be apparent to the skilled person.

BRIEF DESCRIPTION OF THE FIGURES

Examples of the present invention will now be described in detail with reference to the accompanying drawings, in which:

FIG. 19 shows a method of combining the bits from three coarse codewords into a single word;

FIG. 20 illustrates the pre-allocation of bits to signal A; and,

FIG. 21 shows a touchup encoding that allows resolution to be distributed evenly between two signals whether an even or an odd number of touchup bits is forced.

DETAILED DESCRIPTION

As noted above, entropy coding is commonly used to provide a digital representation of a signal that uses fewer bits for commonly occurring signal values or patterns, and more bits to represent less usual patterns. In video coding, advantage is taken of correlation of adjacent pixels, for example by transforming to a frequency representation using a Discrete Cosine Transform, so that fewer bits are required for areas of smooth colour than for edges or for heavily textured areas. In audio coding, a steady tonal signal can be coded to few bits either by transforming to a frequency representation or by using prediction, more bits being required to describe a transient or a noiselike signal.

If values representing the signal (for example sample values, prediction residuals, or frequency domain coefficients) are coded using Linear Pulse Code Modulation (LPCM), then, if it is not possible to store or transmit the resulting codewords in their entirety, it is traditional to truncate the codewords by discarding one or more least significant bits. This is likely to result in the decoded signal being a slightly less accurate reconstruction of the original, which is permissible in lossy coding. In the case of quantisation followed by coding, the truncation can be considered as equivalent to quantising with a larger step-size.

It is in general not possible to truncate codewords of entropy coded data, because a change in the value of any bit will potentially cause a large change in the decoded signal. Hence an encoder according to the invention divides data representing the signal into two types, coarse and fine. Only the coarse data is entropy coded, thus allowing the fine data to be truncated or otherwise replaced provided some loss of signal resolution is acceptable.

Figure 1:
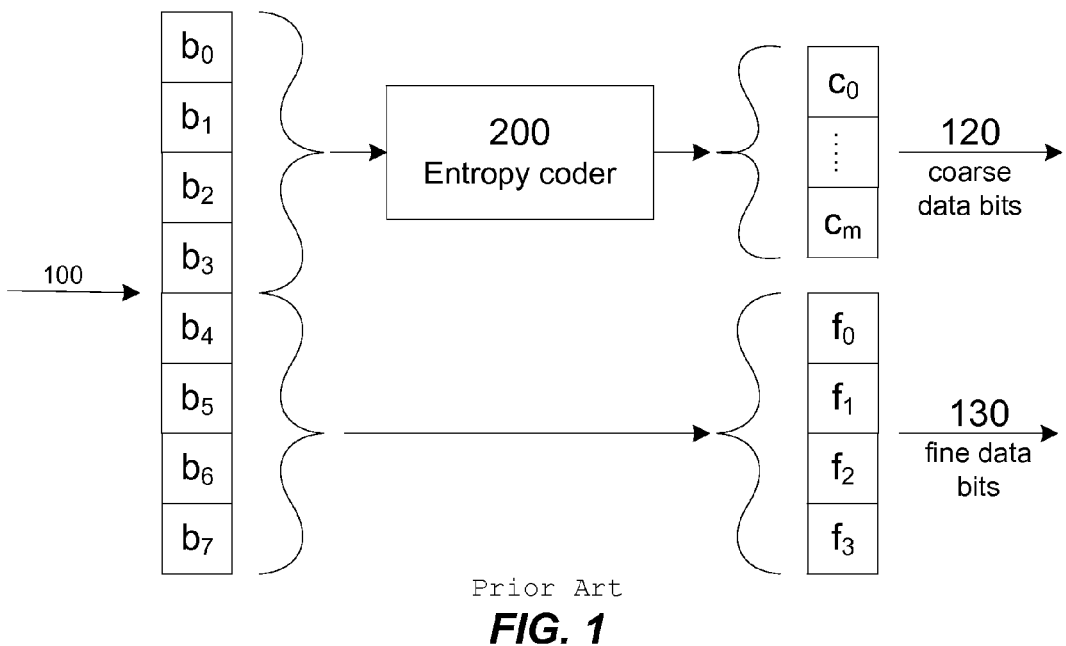
FIG. 1 shows an example of splitting binary PCM data into coarse and fine data bits.
Figure 2:
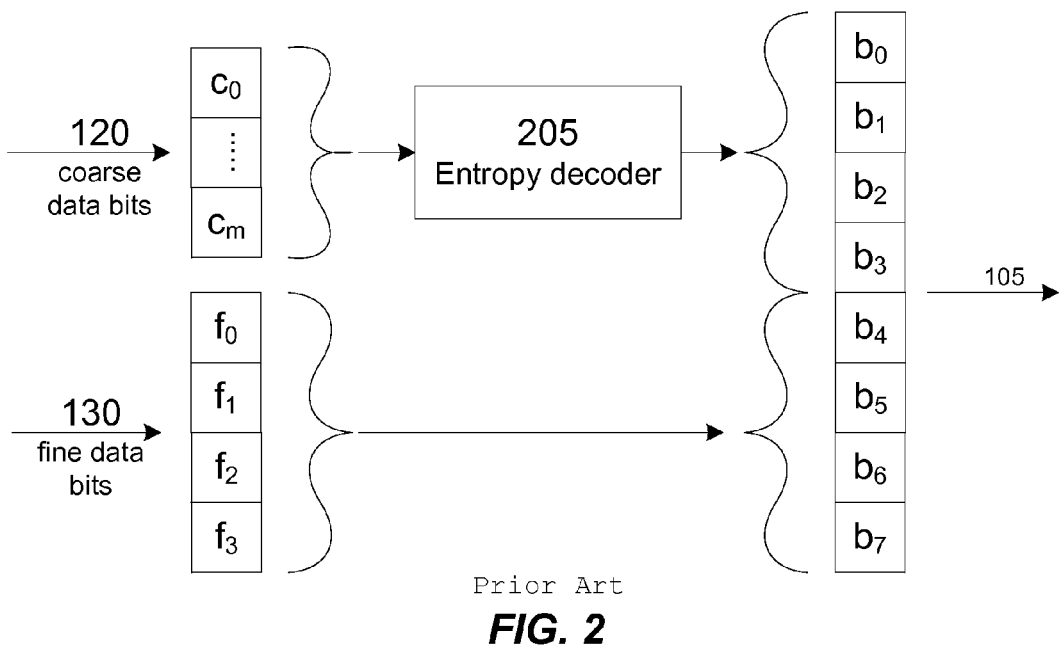
FIG. 2 shows an example of merging coarse and fine data bits into binary PCM data (the converse operation to that shown in FIG. 1)

An example of division into coarse and fine bits is shown in FIG. 1. An eight-bit Pulse Code Modulation (PCM) representation of a signal value 100 is divided into most significant bits (MSBs), and least significant bits (LSBs). The four MSBs $b_0 \ldots b_3$ are entropy coded 200 to furnish the coarse data bits 120, i.e. $c_0 \ldots c_m$, where m is variable, while the LSBs $b_4 \ldots b_7$ provide the fine data bits $f_0 \ldots f_3$ directly (130). FIG. 2 shows the converse operation of entropy decoding (205) the coarse bits and merging with the fine bits to reconstitute a replica 105 of the original PCM word.

Such a division into MSBs and LSBs is provided by the prior art codec described in published U.S. Pat. No. 7,272,567 to Fejzo, "Scalable lossless audio codec and authoring tool", which allows truncation of the LSBs in order to limit the size of the encoded data.

The division into coarse and fine data provides the key to solving the problem previously mentioned, that the packing of data of variable-rate entropy-coded data into a fixed-rate stream is wasteful, because of the need to provide capacity for the maximum likely data rate, and hence the waste of capacity when the rate is the less than the maximum. According to the invention, the optional "fine" bits are allocated to predetermined fine bit positions within the compressed data produced by an encoder, and these predetermined positions overlap positions that might be occupied by the coarse data bits. The coarse data bits take priority, and in a crude implementation are simply allowed to overwrite fine data bits as necessary. In a more sophisticated implementation, coarse data bits are allowed to pre-empt the fine bits. Here the fact that a fine bit position not available to receive a fine bit because it is already occupied by a coarse bit is notified to the process that divides data into coarse and fine bits, so that new coarse bits and/or fine bits may be modified in consequence. Another way to express this concept is to say that the value of a fine bit has been forced, that is, it has been forced to be the same as the value of the coarse bit that occupies the fine bit position that was predetermined in relation to the fine bit.

When the signal is such that coding generates a larger number of coarse bits, the available number of unforced fine data bits will be reduced. It is advantageous if the resolution enhancement provided by the fine bits is designed to degrade gracefully when fine bits are forced one by one. In the case of fine bits representing the LSBs of a PCM encoding, it is desirable to ensure that these bits be forced progressively, starting from the least significant, as the number of coarse bits increases. Thus "difficult" parts of the signal that require more coarse bits will have less resolution enhancement. The result may be similar to that obtained when, as described previously, quantisation and coding are considered together and resolution is adjusted iteratively until the coded data fits the available space. However the invention provides this result more naturally and without the computational overheads and delay involved with trial encodings.

This document will refer to touchup bits. In a simple embodiment, touchup bits can be identified with fine bits. More generally, touchup bits are bits that are conditionally placed into predetermined touchup bit positions within the compressed data, but which may be overwritten or preempted by coarse bits. It is sometimes advantageous to include information that would not normally be regarded as "fine" within the touchup bits, as will be described. A collection of touchup bits relating to a signal sample or jointly coded group of samples is similarly referred to as a touchup codeword.

When a signal is presented in sampled form, samples may be quantised and coded individually or in jointly in groups. Generally the result of such quantisation will be a coarse codeword and a "corresponding" fine codeword. In the case of individual quantisation but joint entropy coding, there may be a single coarse codeword but several fine codewords. These several fine codewords may however be concatenated, or interleaved, or alternatively combined in a more advanced manner as will be described later with reference to FIG. 21 to produce a single touchup codeword. Similarly, coarse codewords can be combined if appropriate, as will be described later with reference to FIG. 19.

Groups of samples that could be quantised or coded together would include neighbouring samples in a video or image application, or neighbouring transform coefficients in the case of a transform codec whether for image or audio applications. A multiband Adaptive Differential Pulse Code Modulation (ADPCM) codec also provides opportunity to use the invention in connection with joint quantisation or coding, as will now be illustrated.

Multi-Band ADPCM Audio Codec

Figure 3A:
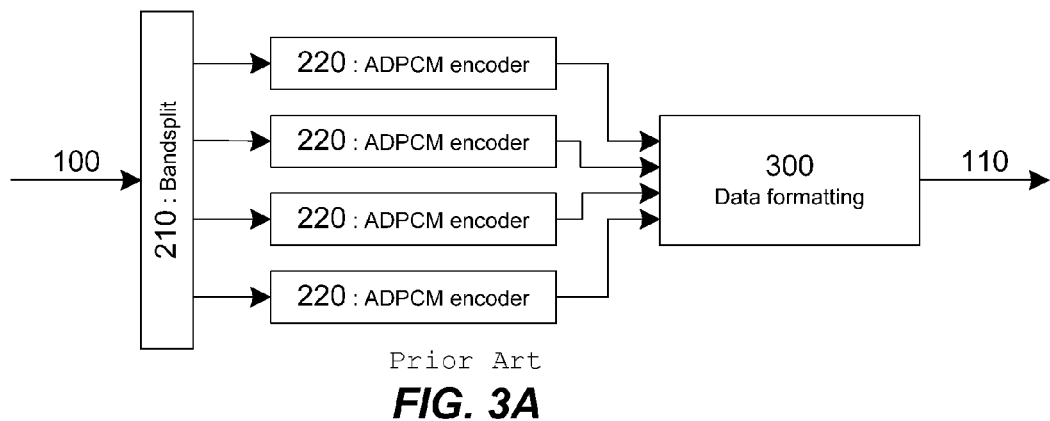
FIG. 3A (prior art) shows encoding with multiband compression of an audio signal.
Figure 3B:
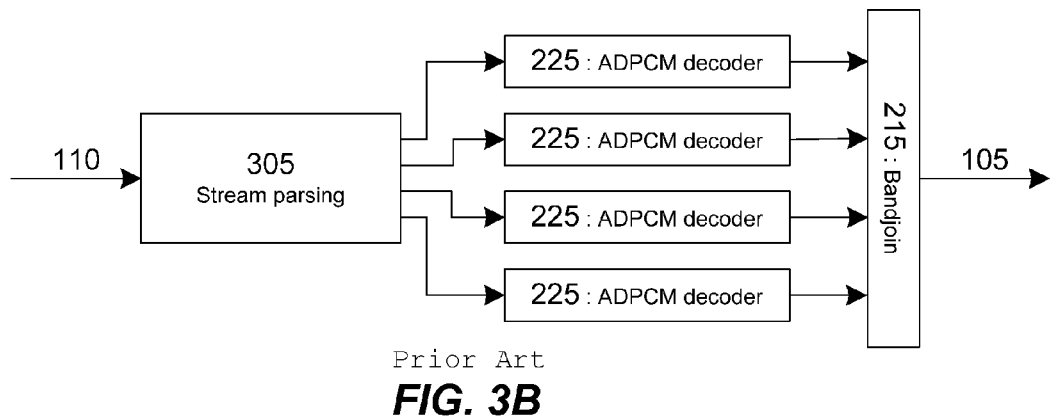
FIG. 3B (prior art) shows decoding with multiband compression of an audio signal.

Adaptive Predictive Pulse Code Modulation (ADPCM) is a compression method widely used for audio signals, either as a full-bandwidth algorithm or applied to individual frequency bands within a multi-band coder. Such a multi-band encoder having, in the case, four frequency bands, is shown in FIGS. 3A and 3B. In FIG. 3A, the Bandsplit unit 210 splits the incoming audio signal 100 into four bands by filtering and decimation, using polyphase filtering or other methods well known in the art. Each band is then coded by a single channel ADPCM encoder 220 and the four streams of coded data are then formatted (300) into a compressed data stream 110 for transmission or storage. In the decoder of FIG. 3B, the compressed data stream 110 is parsed (305) in order to retrieve the four streams of coded data, which are individually decoded by single-channel ADPCM decoding units 225, resulting in four frequency bands which are combined in the Bandjoin unit 215 to produce an approximation of the original audio signal.

Figure 4A:
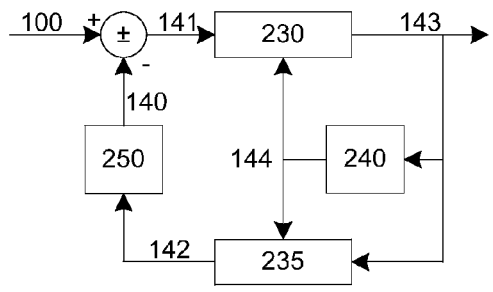
FIG. 4A (prior art) shows detail of the ADPCM encoding unit of FIG. 1.
Figure 4B:
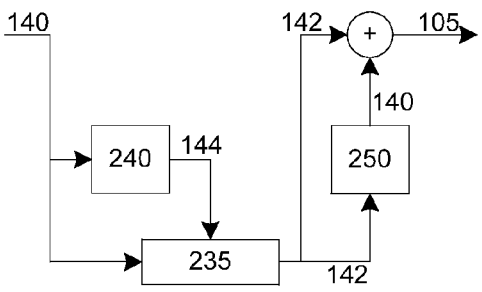
FIG. 4B (prior art) shows detail of the ADPCM decoding unit of FIG. 1.

The single channel ADPCM encoder and decoder are shown in more detail, respectively, in FIG. 4A and FIG. 4B. In FIG. 4A an uncompressed signal sample 100 feeds a subtractor which subtracts a predicted estimate 140 to form a prediction residual 141. Quantiser 230, which may typically be nonlinear, quantises the residual 141 to produced quantised value 143, which is the output of the ADPCM encoding unit and takes one of a predetermined finite number of values. Inverse quantiser 235 typically interprets 143 as an index into a table of reconstruction levels to furnish 142, an approximation to 141. Predictor 250 computes the prediction signal 140 from previous values of 142. To allow the quantiser's resolution to follow the large dynamic range found in many audio signals, the adaptation unit 240 dynamically adjusts the scaling factor 144 which scales the action of both 230 and 235.

Assuming that the output 143 of FIG. 4A is received without error as the input to the ADPCM decoder of FIG. 4B, then ideally the signals 144, 142 and 140 shown in FIG. 4B will be identical to their counterparts in FIG. 4A. The final addition in FIG. 4B is intended to invert the subtraction in FIG. 4B, but since the prediction residual 141 is not available within the decoder, the inverse quantised signal 142 is used as the first input to the addition, so that the decoder's final output 105 is only an approximate reconstruction of the encoder's input signal 100.

Figure 5:
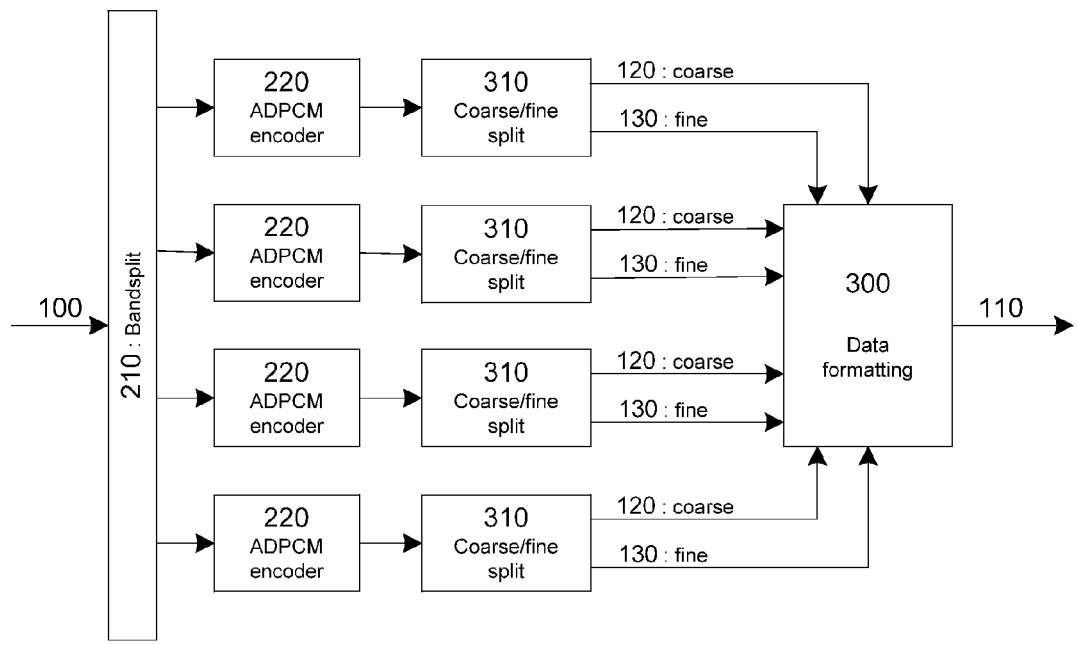
FIG. 5 shows a multiband encoder like that shown in FIG. 1, incorporating a coarse/fine splitter.

A multi-band encoder and a multi-band decoder according to the invention are now described with reference to FIG. 5 and FIG. 6, respectively. In FIG. 5, the output of each ADPCM encoder 220 is split into coarse 120 and fine 130 data bits, for example using a splitter similar to the one shown in FIG. 1. The data formatting unit 300 must then assemble the variable number of coarse bits 120 and the fine bits 130 from each ADPCM encoder into a data stream, coarse bits taking priority over fine bits if there is not sufficient space in the output format for both.

Figure 6:
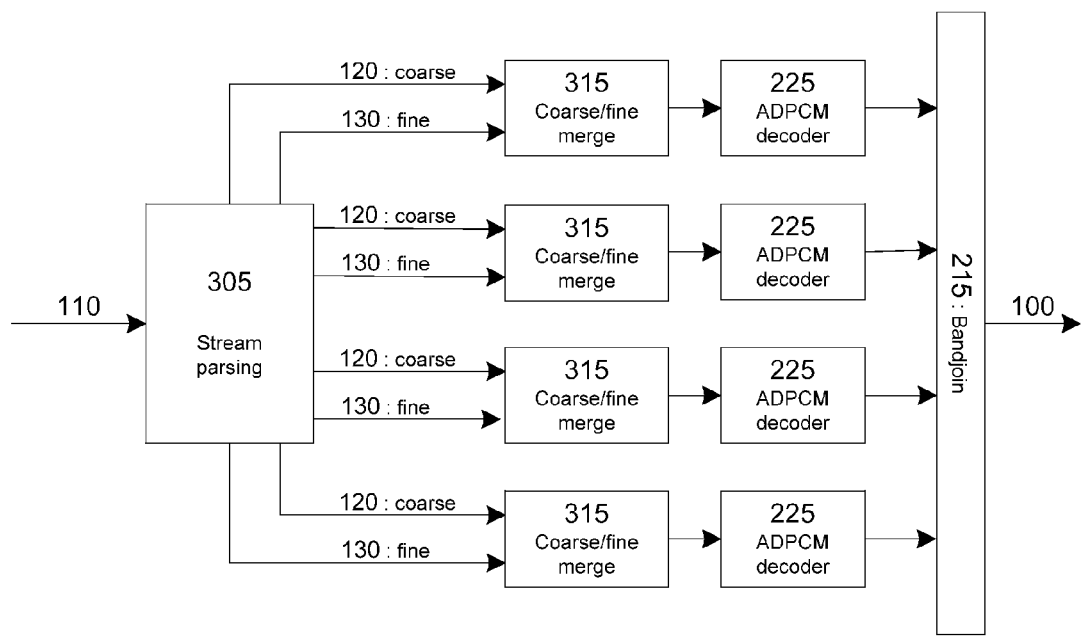
FIG. 6 shows a multiband decoder (the converse to the encoder of FIG. 5)

In the corresponding decoder of FIG. 6, the coarse and fine bits are merged (315) in a manner such as the one shown in FIG. 2 to furnish input signals suitable to feed to the ADPCM decoder 225 of each frequency band. Firstly however, the coarse 120 and fine 130 data bits must be retrieved by parsing (305) the received compressed data stream 110. In general, if the stream has insufficient space to represent all the coarse bits and all the fine bits without overlap, then some bit positions within the stream that are have nominally been assigned to fine data bits 130 will have been occupied by coarse data bits 120. The fine data bits retrieved by parsing the data stream may therefore differ from the fine data bits that were provided to the data formatting unit in the encoder of FIG. 5, a matter that will be considered in more detail later.

It is often preferable to use joint quantisation of samples, or to use joint coding of independently quantised samples. In audio applications, examples of groups of samples that might be quantised and/or coded jointly would include: samples adjacent in time from a single-channel audio signal; co-temporal samples from a multichannel audio signal; and, co-temporal signals from different frequency bands in a multi-band codec.

If joint quantisation (also known as vector quantisation) is used, there is not necessarily a natural ordering of the possible values that the quantiser output s can take, and it is more helpful to regard s as a symbol than as an integer. With joint coding, the entity to be coded is a composite symbol: the Cartesian product of the individual symbols s that are to be jointly coded. A coding method such as Huffman coding can deal efficiently with these cases, and in all cases a variable-length codeword is produced.

Compactification of Codewords Using a Conveyor

As a further preliminary to explaining the invention, a method of using a "conveyor" to compactify variable width codewords, in an attempt to reduce the variability and the maximum width, will now be discussed with reference to FIG. 7.

Figure 7A:
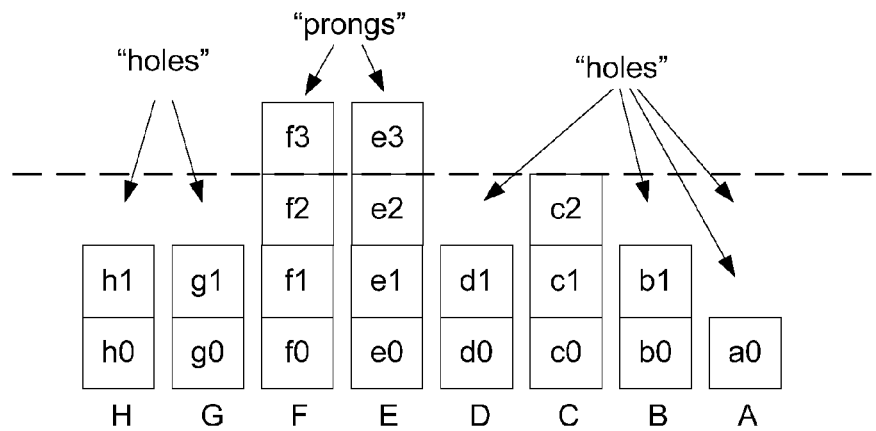
FIGS. 7A, 7B and 7C illustrate use of a conveyor to fit variable-length data into slots of constant size.

FIG. 7A shows a conveyor divided into eight slots A, B, C, D, E, F, and G, each slot capable of holding up to three bits. Corresponding to the slots are eight codewords a, b, c, d, e, f, g and h, having widths of 1, 2, 3, 2, 2, 4, 4, 2 and 2 bits respectively. Codeword a contains bit $a_0$; Codeword b contains bits $b_0$ and $b_1$ and similarly for the other codewords.

If a codeword contains more than three bits, the excess bits (lying above the broken horizontal line in the diagram) are called prongs; conversely if a codeword contains fewer than three bits, then its slot has one or more holes which can be filled by prongs from somewhere else.

Figure 7B:
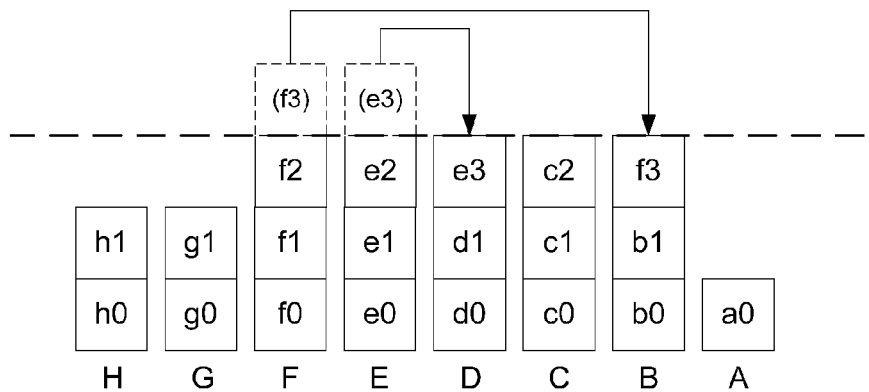

A preferred method of allocating prongs to vacant holes is shown in FIG. 7B. The codewords are considered in sequence from right to left, and the prong e3 has been moved from slot E to the nearest preceding available hole, which is in slot D. Then prong f3 is similarly moved to the nearest preceding available hole, which is now in slot B.

This conveyor-based encoding method maintains error-resilience because a decoder can find the start of each codeword in a position that is independent of the decoding of other entropy-coded data. Provided the codeword fits completely within its slot, it will be correctly decoded irrespective of bit-errors that corrupt bits of other codewords. Only the prongs are vulnerable to corruption of other codewords. For example, if bit $e_1$ had been corrupted, the decoder might have terminated the decoding of codeword e at that point, considering the third bit position of slot E to be a hole. In that case, when decoding codeword f, the decoder would expect bit $f_3$ to be in that third bit position of slot E, and would erroneously decode bit $e_2$ in place of $f_3$.

Figure 7C:
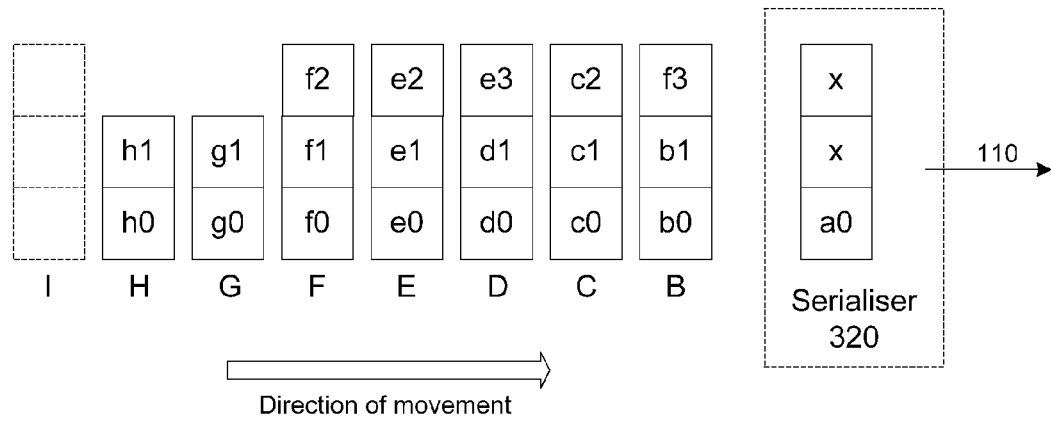

Unlike some other methods of compactifying data, the conveyor method is particularly suited to low-delay streaming applications. Referring to FIG. 7B, once protruding prongs have been reallocated to holes, the contents of slot A can be released for transmission: for example the bits contained in the within the slot may be passed to a serialiser. The conveyor then shifts one slot to the right, creating an empty slot I on the left as shown in FIG. 7C. To create a stream having a fixed data rate, the same number of bits, in this case three, is passed to the serialiser 320 at each time step. Since the slot A contains only a single bit a0, two of the three transmitted digits will contain arbitrary filler values 'x', representing a wastage of space.

A newly-generated codeword can now be considered for placement in slot I. If it is too big, i.e. if there is a prong, a search is made, from left to right, i.e. from slot H through to slot B, for holes into which to place the bit or bits from the prong. In the case illustrated, two excess bits could be placed, in slots H and G, but three excess bits would cause an error condition.

Parsing and Decoding of Conveyor-Generated Data

If no further prongs are generated then serialisation of the conveyor slots shown in FIG. 7C, in order from bottom to top, would produce a data stream containing the following bits:

a0, x, x, b0, b1, f3, c0, c1, c2, d0, d1, e3, e0, e1, e2, f0, f1, f2, g0, g1, x, h0, h1, x

Figure 8:
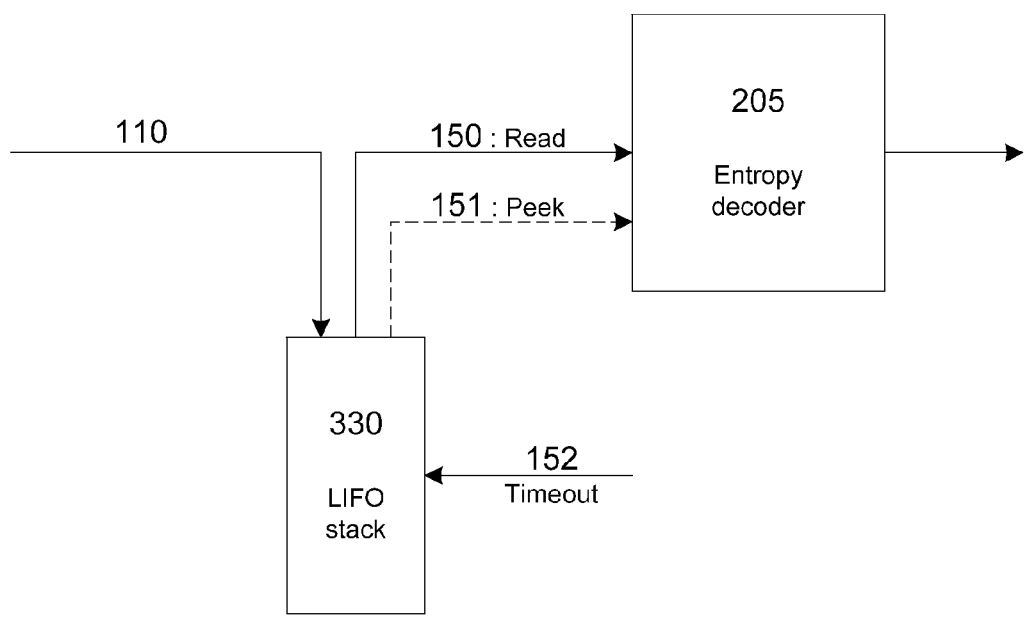
FIG. 8 illustrates use of a stack to decode data encoded according to FIGS. 7.

Decoding of these bits can be done with the aid of a LIFO (last-in-first-out) stack, as will now be described with reference to FIG. 8. At each time step three bits from the compressed data stream 110, representing a composite codeword emitted by serialiser 320, are pushed on to the stack 330. The entropy decoder 205 then "pops" the stack, i.e. it destructively reads 150 from the stack 330 and decodes the most recently pushed bit or bits. Assuming that the variable-width codewords in FIG. 7A were encoded using a prefix code, the entropy decoder 205 in FIG. 8 knows after each bit whether another bit needs to be popped in order to assemble and decode a complete codeword. This number may be greater or smaller than the number of bits that were pushed at the current time step.

Table 1 below lists the pushing and decoding operations that would be used to parse and decode the above data stream. The state of the stack after each action is also recorded.

TABLE 1

| Action | | Stack | | | | | |
|---|---|---|---|---|---|---|---|
| | | | | (empty) | | | |
| Push | (a0, x, x) | | | | a0 | x | x |
| Decode | a0 | | | | | x | x |
| Push | (b0, b1, f3) | | b0 | b1 | f3 | x | x |
| Decode | b0, b1 | | | | f3 | x | x |
| Push | (c0, c1, c2) | c0 | c1 | c2 | f3 | x | x |
| Decode | c0, c1, c2 | | | | f3 | x | x |
| Push | (d0, d1, e3) | | d0 | d1 | e3 | f3 | x | x |
| Decode | d0, d1 | | | | e3 | f3 | x | x |
| Push | (e0, e1, e2) | e0 | e1 | e2 | e3 | f3 | x | x |
| Decode | e0, e1, e2, e3 | | | | | f3 | x | x |
| Push | (f0, f1, f2) | f0 | f1 | f2 | f3 | x | x |
| Decode | f0, f1, f2, f3 | | | | | | x | x |
| Push | (g0, g1) | | | g0 | g1 | x | x | x |
| Decode | g0, g1 | | | | | x | x | x |
| Push | (h0, h1, x) | | h0 | h1 | x | x | x | x |
| Decode | h0, h1 | | | | x | x | x | x |

At the end of each decoding step, the stack contains only filler values 'x' or 'prong' bits that will be decoded later. Thus in the encoder, prongs e3 and f3 are moved from their original slots to slots that are transmitted earlier; in the decoder these prongs are therefore received earlier but are held in the stack until the remaining bits from the same original slot have also been received.

Filler values 'x' in the stream are never decoded and will remain in the stack permanently. Because the encoder performs prong-hole rearrangement on a finite buffer, a prong may be moved forward by only a finite number of slots, in this case seven. Therefore, values that were pushed seven or more time steps previously cannot validly contribute to future decoding. An attempt to decode an out-of-date value indicates a bit error in the received data stream. A timeout unit 152 is added, as shown in FIG. 8, to delete out-of-date bits so that the stack 330 does not grow without limit.

Conveyor with 'Touchup'

The invention in its first aspect will now be illustrated with reference to FIG. 9A, which shows the conveyor of FIG. 7B together with means for inserting fine data bits into unfilled holes.

Figure 9A:
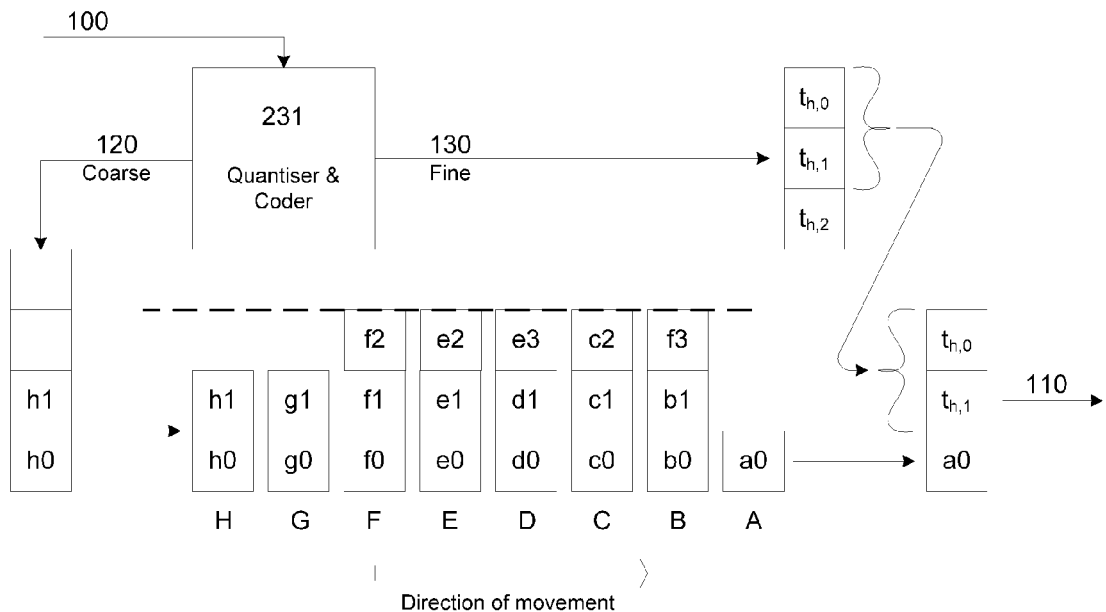
FIG. 9A illustrates an encoder using a conveyor and an elementary method of placing fine data into slots that have been partially filled with coarse data.

In FIG. 9A, a coder or a quantiser/coder combination 200 codes a signal sample into coarse 120 and fine 130 data bits, for example as already described with reference to FIG. 1. At the time step illustrated, coarse bits h0 and h1 are fed to the conveyor, the coder also generating a fine data word 130 containing bits $t_{h,0}$, $t_{h,1}$ and $t_{h,2}$. Arrows appearing in FIG. 9A represent instantaneous transmission of information. It is assumed that moving any prong to an available hole also happens instantaneously as soon a codeword is introduced to the conveyor. For the coarse bits that are not moved in that way, it takes seven time steps for slot H to move to the position currently occupied by slot A.

The contents of the final slot A in the conveyor are then combined with fine data for transmission as a composite word, the fine data occupying any unfilled holes in the slot. Fine data bits in positions that are already occupied by a coarse bit are not transmitted. The composite word in general contains coarse and fine bits from different original samples, because the coarse data bits have been delayed by the conveyor. It might be thought more natural to delay the fine bits also, in order that the coarse and the fine bits from the same symbol could be transmitted together. A delay of seven time steps would be correct in this case. However, in anticipation of an improvement to be described, it is preferred that the encoder does not delay the fine bits, delay instead being provided in the decoder.

Decoding of 'Touchup'

Figure 10:
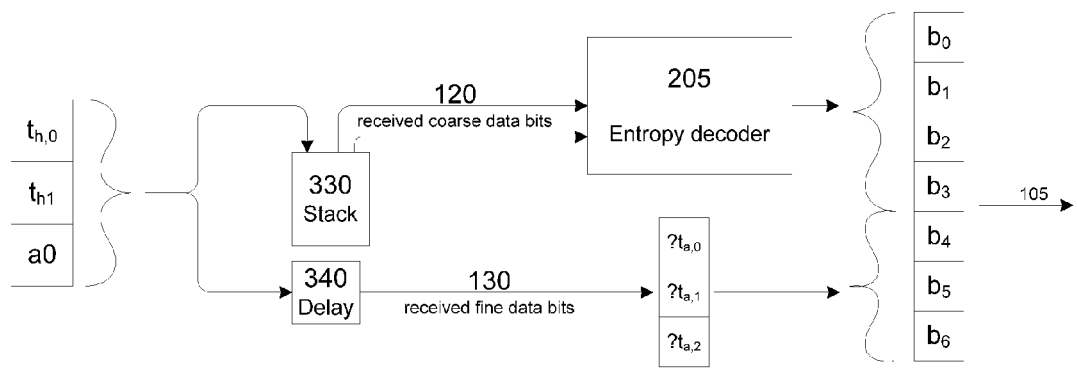
FIG. 10 illustrates decoding of a stream containing coarse and fine data bits.

FIG. 10 shows a method to decode a stream encoded as described with reference to FIG. 9A, suitable for the case where the coder of FIG. 9A generates coarse and fine data using the method shown in FIG. 1. The composite word received by FIG. 10, containing bits $t_{h,0}$, $t_{h,1}$ and a0, is used for two purposes. Firstly, it is fed to a LIFO stack 330 and entropy decoded in the manner of FIG. 8. Secondly, it is passed to a delay unit 340, the output 130 of which provides the received fine data bits $t_{a,0}$, $t_{a,1}$ and a0. The received fine bits and decoded coarse bits relate to the same original symbol and can be combined, for example into a single binary PCM word 105 as shown.

As discussed with reference to FIG. 8, the stack decoding method does not access filler bits in the stream. Accordingly its operation is unchanged when the holes are instead filled by fine data bits. Provided there are no errors in transmission, the received coarse data bits 120 in FIG. 10 are identical to the coarse data bits originally emitted by the coder in FIG. 9A. Hence the most significant bits $b_0$, $b_1$, $b_2$ and $b_3$ of the output word in FIG. 10 will be correct.

The least significant bits $b_4$, $b_5$ and $b_6$ are however significantly likely not to have their correct values. At the time instant illustrated, the correct values for $b_4$ and $b_5$ would be $t_{a,0}$ and $t_{a,1}$ respectively. Whether these values are properly conveyed depends on whether there were holes in the encoder's conveyor at the instant that these fine bits were generated—some seven time steps earlier than is illustrated in FIG. 9A. As for $b_6$, this will always be set equal to a coarse bit, and will thereby have the correct value only by chance, for the bottom bit position in each of the encoder's slots will always be filled if a prefix code is used.

If the output $b_0 \ldots b_6$ of FIG. 10 is interpreted as a PCM encoding of a signal value, it might be thought disadvantageous to include the fine bits $b_4 \ldots b_6$ unless these bits can be guaranteed to have the correct values for most of the time. It could be argued that if these bits were replaced by zeroes then at least they would not add noise to the decoded signal, while replacing them by unrelated coarse data bits will indeed add noise. A more advanced decoder would be able to determine which bit positions in the received data were filled by genuine fine data bits and substitute zeroes (or, an appropriate offset) to prevent coarse data bits from adding noise. However, according to M. A. Gerzon and P. G. Craven, "A High-Rate Buried-Data Channel for Audio CD", J. Audio Eng. Soc., vol. 43 no. 1/2, 1995 January/February, such strategies are unnecessary, for there are simpler and more effective methods of burying other data in the least significant bits of a PCM representation of a signal.

Subtractive Buried Data

A preferred embodiment makes use of the 'subtractive buried data' method described in M. A. Gerzon and P. G. Craven, "A High-Rate Buried-Data Channel for Audio CD", J. Audio Eng. Soc., vol. 43 no. 1/2, 1995 January/February. Subtractive buried data is a method of quantising a signal but 'burying data' by forcing the least significant bits of the binary quantised word to have values that relate to the 'buried data' that is to be carried. Such forcing can trivially be performed after the quantisation has taken place, but the subtractive buried data method teaches how to perform the quantisation in dependence on the data that is to be buried, in order to minimise damage to the signal when decoded.

Figure 9B:
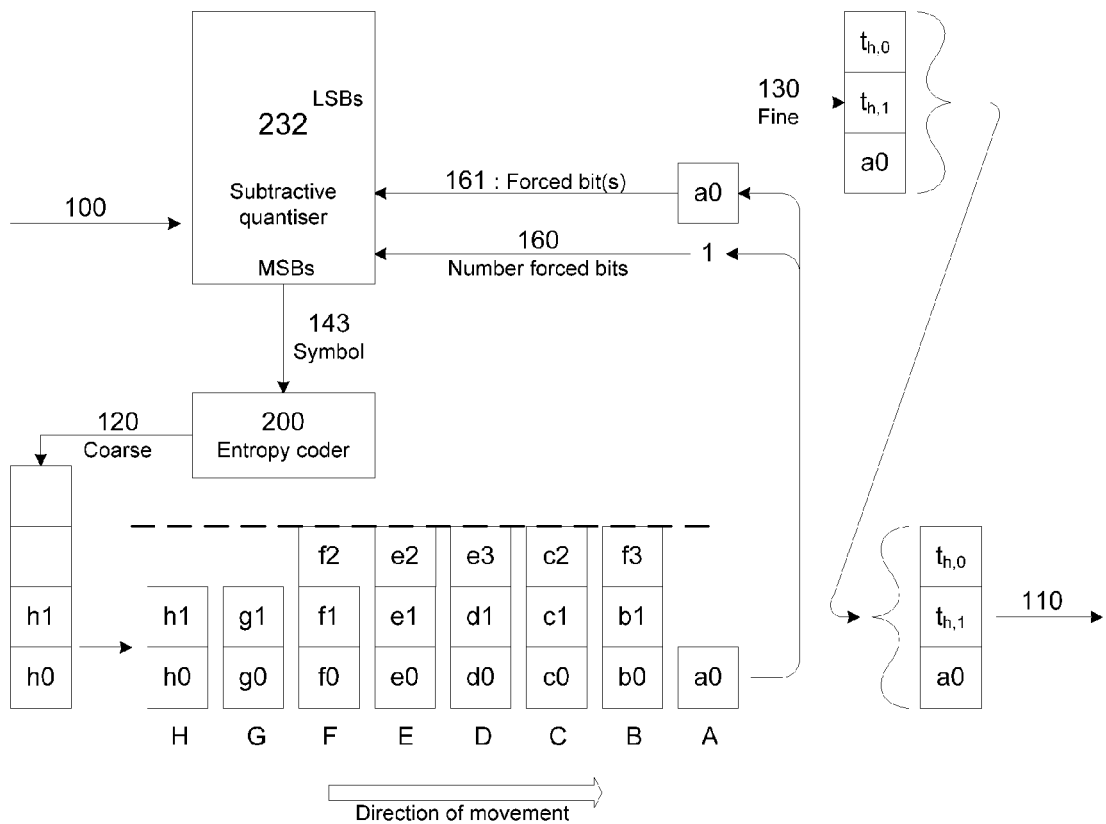
FIG. 9B illustrates an encoder using a conveyor and a more advanced method using the principles of subtractive buried data.

Accordingly, the encoder of FIG. 9B quantises a signal using a subtractive quantiser. It is convenient to consider the subtractive quantiser 232 as delivering separately the MSBs and LSBs of a quantised binary word, the encoder then using the LSBs as fine data bits, while the MSBs are entropy coded to furnish coarse data bits (c.f. FIG. 1).

When quantising a sample, the number of bits available for fine data is determined by the number of holes in the final slot of the conveyor. The coarse data bits in this slot arising from previous samples are regarded as 'forced bits' for the purpose of the quantisation. This is illustrated in FIG. 9B wherein the fine bits 130 relate to the currently coded sample h but the final slot A contains bit a0 arising from previous sample a, which is thereby a forced bit. The subtractive quantiser 232 is informed of the number 160 of forced bits and of their values 161. Thus, at the time step illustrated, there is just one forced bit and it has the value a0. As will be explained later, the subtractive quantiser 232 incorporates any forced bits into the LSB word, and the LSB or fine word containing the forced bit a0 can now be interpreted directly as a composite codeword ready for transmission.

The compressed data stream 110 furnished by FIG. 9B is intended to be decoded by the decoder of FIG. 10, as already described, with little or no modification, giving correct implementation of the 'subtractive buried data' principle. The forced bits notified to the subtractive quantiser in FIG. 9B should also be incorporated into the 'binary PCM' word in FIG. 10 and decoded appropriately. Alternatively, if this results in a word having an inconveniently large number of bits, it is possible to exclude the lowest bits in the slots, which will almost always contain coarse data, from the subtractive process. That is, these bits are not notified to the quantiser as forced bits, and are not incorporated in the 'binary PCM' word in the decoder. In that case the quantiser does not furnish the complete composite codeword, which must be formed by a merging process similar to that shown in FIG. 9A.

The detailed design of an encoder based on FIG. 9B must consider a slightly different constraint on the allocation of prongs to holes. In FIG. 9A, it would be acceptable for newly coded coarse bits to generate a prong that fills all holes in the conveyor. In the case illustrated, a prong the over-fills slot H by three bits would then fill one hole in slot G and two holes in slot A. In FIG. 9B, however, the new coarse bits potentially depend on the values in slot A, creating a circular dependency. It is possible to envisage an advanced encoder that seeks an optimal self-consistent solution to this circular problem, but it is more practical to introduce a delay of one time step as bits are removed from slot A. Alternatively the holes in slot A can be excluded from consideration when reallocating prongs.

At any given time, the conveyor has only a limited number of holes available, and a strategy is needed to cope with bursts of entropy-coded data that might over-fill the available capacity. It is generally not acceptable simply to discard coarse bits. In a preferred implementation, the entropy coder will be informed of the maximum number of coarse bits allowed at the current time step, and will if necessary clip its input. That is, it will encode MSBs representing a value as near as possible to the MSBs provided by the quantiser, while not emitting more coarse bits than allowed.

Figure 11:
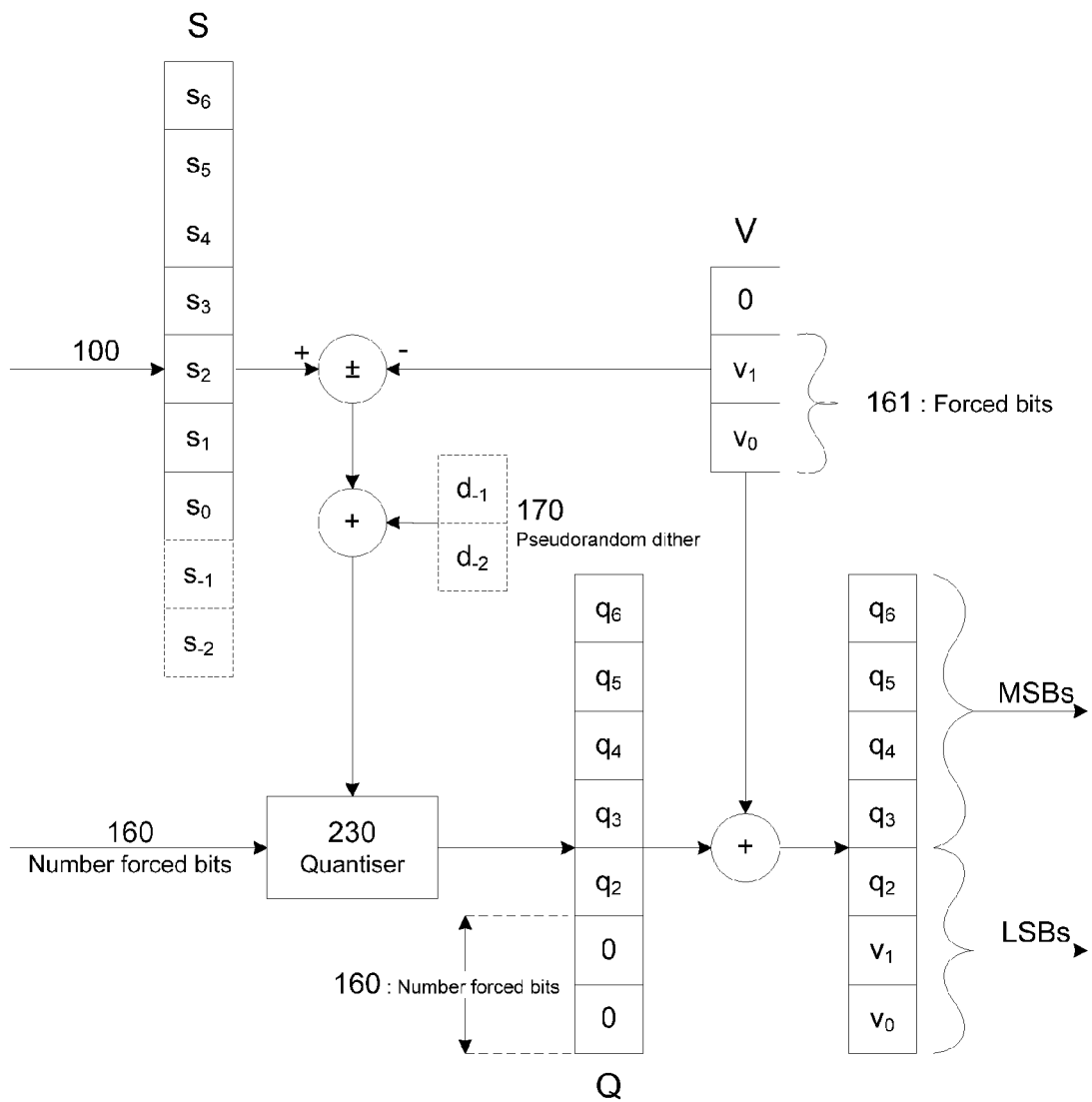
FIG. 11 shows a subtractive quantiser that implements the method of subtractive buried data.

The subtractive quantiser used in FIG. 9B will now be described with reference to FIG. 11. The subtractive quantiser receives an input binary word 100 and furnishes an output word, which for external convenience it divides into MSBs 120 and LSBs 130. The bits of the output word and of the intermediate word Q are labelled $q_0$, $q_1$, $q_2$ etc., where $q_0$ is the least significant and in general bit $q_i$ has significance $2^i$. The input word 100 similarly comprises bits $s_0$, $s_1$, $s_2$ etc., each bit $s_i$ having significance $2^i$. Optionally, the input word may contain bits $s_{-1}$, $s_{-2}$ etc. having fractional significance.

The subtractive quantiser receives also a nonnegative integer 'Number forced bits' 160 indicating how many bits it should force, which we will denote by N. It also receives 'Forced bits' 161, the values to which those bits should be forced. In the example shown in FIG. 11, N=2 and the values of the forced bits are denoted by $v_0$ and $v_1$. In the context of FIG. 9B, up to three bits may be forced and accordingly the encoder assembles a three-bit binary word V containing the N forced bits $v_0$ and $v_1$, padded with zeroes at the MSB end if N<3. In general, bit $v_i$ has significance $2^i$ and V is zero if N=0.

The subtractive quantiser then subtracts V from S and its internal quantiser 230 quantises the difference with stepsize $2^N$ to produce a quantised word Q whose N least significant bits are zero. The quantisation method will normally be to round to the nearest multiple of the stepsize $2^N$. Finally the output word is formed by adding V to Q, and is divided into MSBs and LSBs as already mentioned.

M. A. Gerzon and P. G. Craven in, "A High-Rate Buried-Data Channel for Audio CD", J. Audio Eng. Soc., vol. 43 no. 1/2, 1995 January/February explain how the subtraction of V before quantisation and the addition afterwards causes the forced bits to behave as a subtractive dither signal. The dither can optionally be improved by the addition (or subtraction) of a dither word D containing pseudorandom dither bits to the right of the binary point, i.e. $d_{-1}$, $d_{-2}$ etc. where $d_{-i}$ has significance $2^{-i}$. This is worthwhile only if the signal S also has bits to the right of the binary point. If D is added (subtracted) then it is preferred that D should conversely be subtracted from (added to) the binary word furnished by the decoder of FIG. 10, as recommended by M. A. Gerzon and P. G. Craven in, "A High-Rate Buried-Data Channel for Audio CD", J. Audio Eng. Soc., vol. 43 no. 1/2, 1995 January/February. If this is not done, there will be increased noise and also a systematic offset, which can be removed by adding a bias to D so that its mean value is zero.

The quality of the dither provided by V is dependent on the randomness of the bits $v_0$, $v_1$ etc. In case the coarse bits furnished by the entropy coder in FIG. 9B are not sufficiently random, they may be randomised by an exclusive-OR operation with a pseudorandom bit sequence. Synchronised pseudorandom sequence generators are then needed in the encoder and decoder, and care must be taken to ensure that exclusive-OR operations are performed in consistent positions in the encoder and decoder. For example, if the coarse bits are exclusively ORed at the output of the entropy coder 200 in FIG. 9B, then they must similarly be ORed at the input to the entropy decoder 205 of FIG. 10. An alternative is to exclusively-OR the bits that emerge from the last slot in the encoder's conveyor, before combining with the fine bits. In that case the received composite word must be ORed before being fed to the stack 330 in FIG. 10 (but not before being fed to the delay unit 340 in FIG. 10).

Touchup Variation

While compactification is advantageous, it is not essential to the invention. Referring to FIG. 7A, had compactification not been used it would have been necessary to use slots of width four bits and to pass four bits (instead of three) to the serialiser 320 in FIG. 7C at each time step. Slot A would have three unfilled bit positions, thus allowing three touchup bits to be carried. The number of touchup bits eventually carried along with the coarse codewords in slots A, B, C, . . . H would have been, respectively:

3, 2, 1, 2, 0, 0, 2, 2

With the conveyor-based compactification method applied as in FIG. 7B, but still using slots of width four bits, the number of touchup bits would be, respectively:

3, 1, 1, 1, 1, 2, 2

In each of these two cases the eight slots contain a total of 20 coarse bits and 12 touchup bits, so the total number bits available for touchup information is the same. However, if the touchup bits are interpreted as the least significant bits of a binary word as in FIG. 10, then not all bits have the same significance. In an audio context, expected mean square error may be the appropriate criterion, and sacrificing touchup bit $t_0$ will contribute to the expected mean square error in proportion to $4^{-n}$. It is therefore much more important to retain the touchup bits of higher significance. In the above example, the minimum number of touchup bits in any slot is increased from 0 to 1 by using compactification, and calculation reveals that the expected mean square error is reduced in the ratio 89:161 (just under 3 dB).

Conveyor Organisation

While compactification using a conveyor as described above may be satisfactory under steady state conditions, it is not well adapted to a 'bursty' situation in which the number of coarse bits fluctuates substantially. This will apply when coding nonstationary signals, such as audio signals containing transients and video signals containing edges and variable amounts of texture information. In an audio ADPCM context where the adaptation unit 240 in FIG. 4A is fed in dependence on the quantised signal 143 only, the scale factor 144 must inevitably lag the instantaneous signal envelope and a percussive sound such as a struck instrument is almost certain to result in a few signal samples that are much larger and that code to a much larger number of bits than their immediate predecessors.

As already mentioned, the input to the entropy coder can be clipped to avoid over-filling the conveyor, but this leads to signal distortion. In order to maximise the ability to accommodate a sudden burst of bits from the entropy coder, without clipping, the conveyor should contain as many unfilled holes as possible in normal operation. The number of unfilled holes can be increased in three ways:

the length of the conveyor (number of slots) can be increased—but this increases the coding delay;

the width (number of bits per slot) can be increased—but this increases the compressed data rate;

as will be discussed later, the number of coarse bits can be minimised, signal resolution being conveyed by touchup bits to the maximum extent possible.

If a burst does fill all the available holes in the conveyor, then the composite words presented for transmission will have no ability to convey touchup information, and this situation will persist at least until the current contents of the conveyor have been transmitted. This will typically lead to a gross loss of signal resolution for several signal samples. This is inevitable, but if the burst is smaller, perhaps filling only half the available holes, then there is choice about which touchup bits are lost. We now discuss a variety of conveyor organisations that will lead to different results for bursts that are large but do not completely fill the conveyor.

Figure 12A:
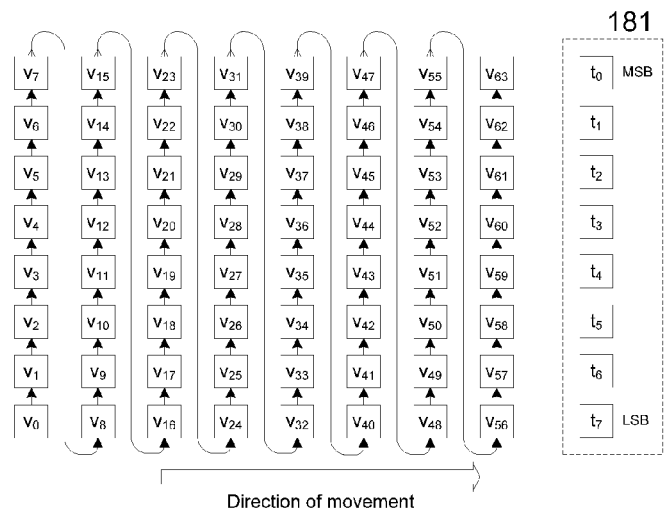
FIGS. 12A, 12B and 12C show a conveyor with priorities assigned vertically.

FIG. 12A represents a 'vertical' organisation of a conveyor of length eight slots, each slot containing eight bit positions. The leftmost slot, containing bit positions $v_0$ through $v_7$, corresponds to slot H in FIG. 9B and receives data from an entropy coder, while the rightmost slot, containing bit positions $v_{56}$ through $v_{63}$, contains the data that will shortly be removed and merged with touchup bits $t_0$ through $t_7$ (181) to make composite codewords for transmission, in a manner such as one of those already described with reference to FIG. 9A and FIG. 9B.

In the discussion of FIG. 7, compactification was described as a process of reallocating prongs to holes. Alternatively the same result can be obtained by supposing that the entropy coder 200 emits the coarse bits 120 as a serial stream, each bit being placed in the first available location in the conveyor.

That is, considering only the locations $v_i$ that do not already contain a bit, each new coarse bit is placed in the location having the lowest index i. The order in which the locations are considered is also indicated by the arrows in FIG. 12A, showing generally a vertical progression.

Figure 12B:
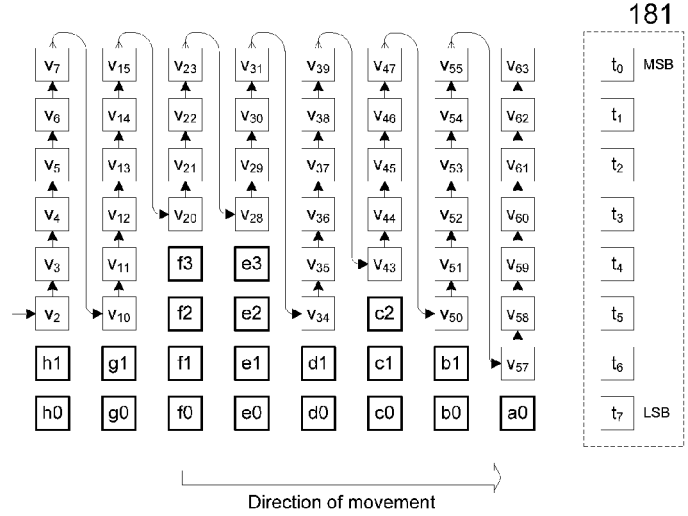

FIG. 12B shows the conveyor occupancy after receipt of the bits from the codewords $(a_0)$, $(b_0 b_1)$, $(c_0 c_1 c_2)$, ... $(h_0 h_1)$ that have been used as examples previously. As the slots are wider (eight bits) than the longest codeword (four bits), each codeword fits into one slot. If the last codeword had more bits than the two bits ($h_0$ and $h_1$) shown, the first additional bit would placed in location $v_2$, the next in $v_3$, and so on, skipping the locations that are already occupied as shown by the arrows.

Figure 12C:
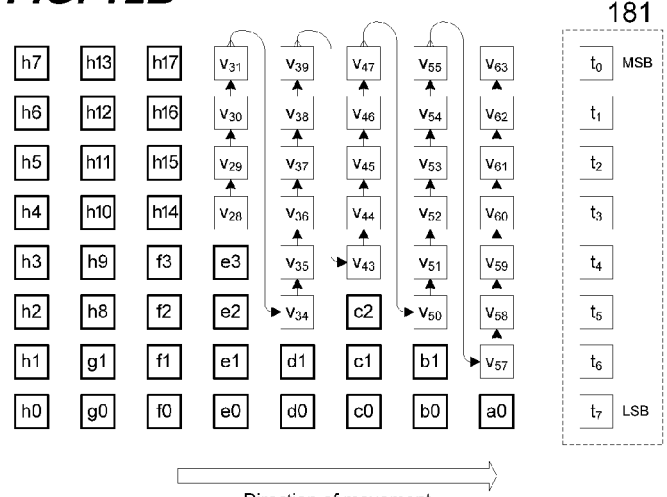

FIG. 12C shows the allocation of bits that would thus result if the last codeword had eighteen bits. Any further bits will occupy positions from $v_{28}$ onwards, as indicated by the arrows.

An unfortunate feature of this allocation is the very large variation in the number of touchup bits that can be carried in the transmitted composite word. As the first three slots are completely filled, the number of bits available for touchup has been reduced to zero on three time steps, contrary to the aim stated above of retaining the touchup bits of higher significance if possible.

Figure 13A:
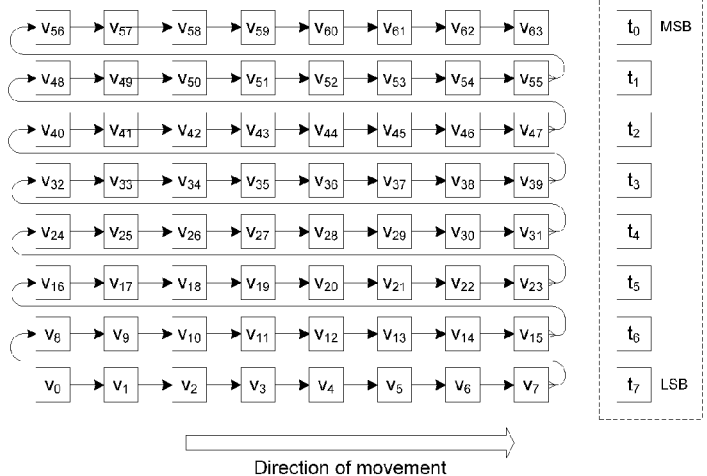
FIGS. 13A, 13B and 13C show a conveyor with priorities assigned horizontally.
Figure 13B:
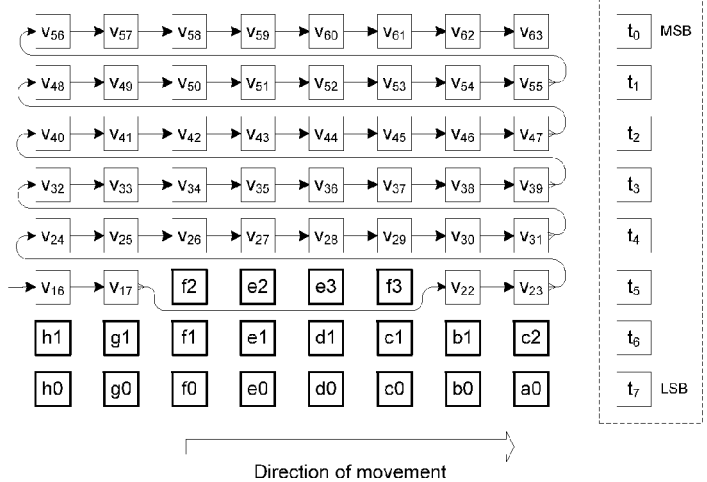

The 'horizontal' conveyor organisation of FIG. 13A addresses this problem. Here the locations in the conveyor have been re-labelled so that the order of preference for the allocation proceeds generally horizontally from one slot to the next, as indicated by the arrows, rather than vertically within the same slot. FIG. 13B is akin to FIG. 12B, showing the conveyor occupancy after the bits from the codewords $(a_0)$, $(b_0 b_1)$, $(c_0 c_1 c_2)$, ... $(h_0 h_1)$ have been placed. Any further bits will now be placed starting at $v_{16}$ and $v_{17}$, skipping the next four occupied locations and resuming at $v_{22}$ as indicated.

Figure 13C:
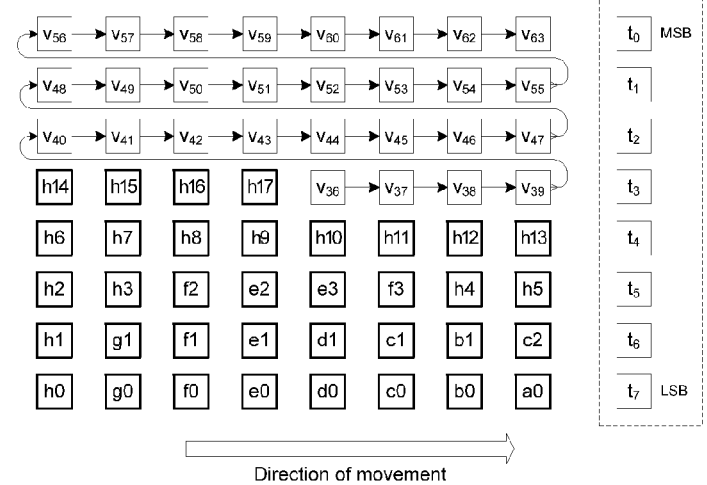

If the last codeword has eighteen bits, then the situation of FIG. 13C obtains. This is much more favourable than that shown in FIG. 12C, since now there will be at least three available touchup bits at each time step, assuming that the positions shown as vacant do note become filled by bits from subsequent unusually large coarse codewords. The error-resilience properties of the horizontal organisation are however generally inferior to those of the vertical organisation.

Figure 14A:
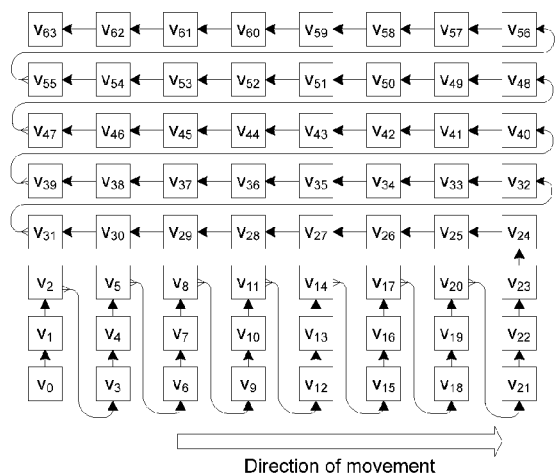
FIGS. 14A, 14B and 14C show a conveyor split into a vertical zone and a horizontal zone with FIFO ordering.

Some of the advantages of both organisations can be obtained by using a hybrid organisation, an example of which is shown in FIG. 14A. Here the lower three rows of the conveyor are organised vertically, while the upper five rows are organised horizontally.

Figure 14B:
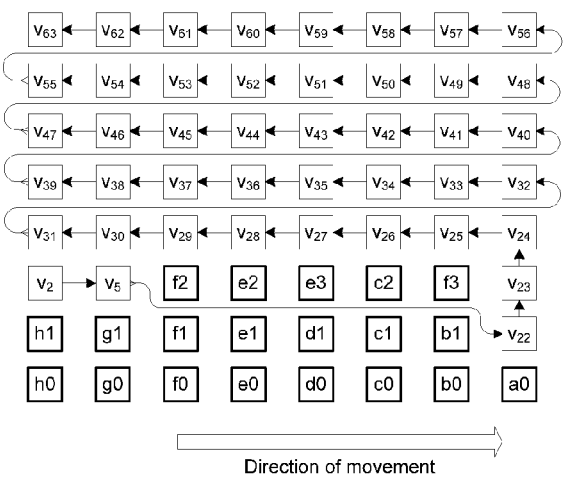

0b FIG. 14B shows the conveyor occupancy after the bits from the codewords $(a_0)$, $(b_0 b_1)$, $(c_0 c_1 c_2)$, ... $(h_0 h_1)$ have been placed. The same rules have been applied as in the previous two cases, the difference being only in the layout of the bit positions labelled $v_0, v_1, \ldots v_{63}$. It will be seen that the resulting arrangement of the codeword bits in FIG. 14B is identical to that produced by applying compactification to slots of width three, c.f. FIG. 7B.

Figure 14C:
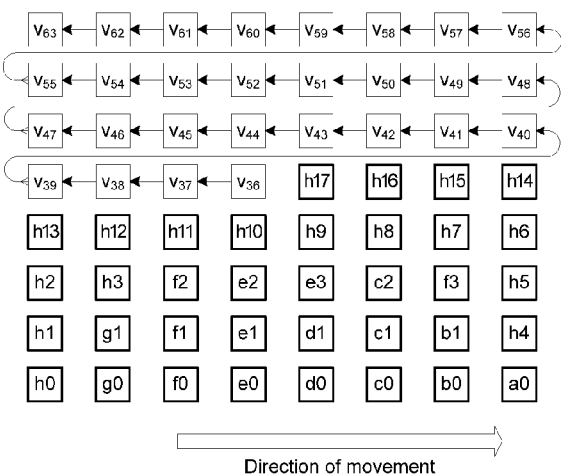

FIG. 14C shows the allocation of codeword bits that is obtained if the last codeword has eighteen bits. It will be seen that the hybrid organisation of FIG. 14C is as effective as the purely horizontal organisation in ensuring that at least three touchup bits are retained at each time step (c.f FIG. 13C).

In the hybrid organisation, there is choice over whether the bit positions $v_i$ in the horizontal zone should be arranged with the index i increasing in a left-to-right direction or in a right-to-left direction. FIG. 14C shows the right-to-left case. Considering the fourth row down in FIG. 14C, it will be seen that any new bits will be placed to the left of the codeword bits h17, h16, h15 and h14, while bits for transmission are removed from the right. Each row in a right-to-left horizontal zone thus has the character of a FIFO—an architecture that is known for poor bit error resilience. If the effect of the FIFO is that coarse bits emerge from a row of the conveyor in a contiguous stream, this will potentially allow a single bit error to cause incorrect decoding of an indefinite number of codewords, as explained earlier for contiguously packed codewords that are coded according to a prefix code. However, the contiguous stream will be interrupted if the FIFO empties and the indefinite propagation of the error is then terminated.

The hybrid organisation with a FIFO-like horizontal zone—a 'FIFO zone'—is thus recommended only if the average number of coarse bits is well controlled, so that for most of the time only the vertical zone is occupied and the good error resilience properties of conveyor-based compactification will be enjoyed.

The right-to-left organisation has the advantage over left-to-right that as soon as a row starts to be occupied, the coarse bits are at the right hand end and will start to be transmitted immediately, thus emptying the conveyor and maximising the room for a further burst of coarse bits before the conveyor becomes full. In practice this advantage may be small, and if the average number of coarse bits is less well controlled then the left-to-right organisation of the horizontal zone may be preferable so as not to risk extended periods of FIFO-like error propagation.

If the average number of coarse bits becomes substantially less than the height (three in the case of FIG. 12) of the vertically-organised zone of a hybrid conveyor, the conveyor will then provide little control of the stochastic variation in the number coarse bits, and the variation in the number of available touchup bits will be nearly as great as if no conveyor has been used. A plain left-to-right horizontal organisation may thus be best if the average number of coarse bits varies significantly over extended periods of time. The hybrid organisation works best when, other than during brief bursts, the average number of coarse bits is tightly controlled to a value slightly lower than the height of the vertically-organised zone.

If any of the conveyors is used in conjunction with subtractive buried data, either the last column must be avoided (reducing the useful conveyor length by one), or a delay of one time step must be inserted when removing bits from the last column, as mentioned previously in order to avoid a circular dependence in the calculation.

Figure 16:
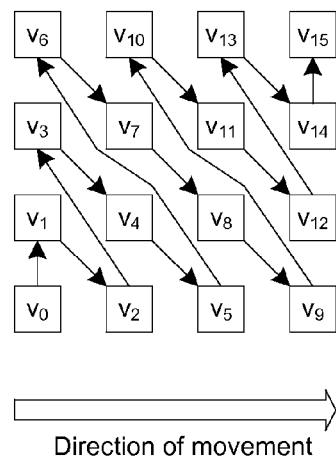
FIG. 16 shows a conveyor with priorities assigned diagonally.

The invention is not restricted to horizontal and vertical conveyor organisations. Other organisations such as the diagonal one shown in FIG. 16 also lie within the scope of the invention.

Conveyor Decoding

So far, a conveyor has been described as a component of an encoder. A decoder can be constructed on the principle of maintaining a replica of the encoder's conveyor. If the bits from the right hand column of the encoder's conveyor are incorporated into a composite codeword, as described with reference to FIGS. 9A and 9B, and transmitted to the decoder, then the decoder can reconstruct an image of the encoder's conveyor that contains at least the coarse bits that have been illustrated in figures such as FIG. 14B. There is an intrinsic delay before this image can be completed, since only one column of the conveyor is transmitted at each time. FIG. 14 is a snapshot and some of the unused bit positions indicated by $v_i$ in FIG. 14B may become occupied by coarse bits from codewords emitted subsequently by the entropy coder. These additional bits will therefore appear in the image reconstructed by the decoder, as will touchup data. The additional bits do not however interfere with the decoding process that will now be described.

We assume that the decoder has already decoded one codeword, and in doing so has marked the bit positions in the conveyor that it has identified as belonging to that codeword. In progressing to the next time step, the marks shift one place to the right along with the bits in the conveyor. The labelling of bits positions $v_i$ however does not shift. The bits of the next codeword are then extracted in sequence, starting from the position $v_i$ that, of the positions that have not already been marked, has the lowest index i, and continuing to the next index i that identifies a position that has not been marked. Each bit position is marked as the bit is extracted. The decoder determines when the last codeword bit has been extracted either by examining the bits themselves (for example, if a prefix code has been used), or otherwise.

Some worst-case bounds on error propagation can be determined from this decoding model. An erroneously decoded bit potentially affects the marking of all bit positions having a higher index i. At the next time-step, these potentially affected bit positions move one place to the right. If the set of potentially affected bit positions now includes a position having the same or lower index i as the bit position that contained the erroneously decoded bit, then an error condition can propagate, potentially without limit. Otherwise, by considering the lowest index i that might be affected, it can be determined what is the maximum number of time steps for which the error can remain in the system.

Such a bound on error propagation also assures us that the decoding process does not require special precautions at startup: if the about assumption about the first codeword having been decoded already is incorrect, the next codeword may be decoded incorrectly, but correct decoding will be obtained after a few time steps.

Some conveyor organsiations allow a more efficient decoding method to be used. For example, a stream encoded using a vertically organised conveyor may be decoded using a LIFO stack 330 as described with reference to FIG. 8.

As mentioned above, there is an unavoidable delay before the decoder can reconstruct an image of the encoder's conveyor, and this leads directly to a delay in decoding the coarse bits. There is no such intrinsic delay in decoding the touchup bits, so a compensating delay may be required in the touchup path as indicated in FIG. 10.

Conveyors with Variable-Height Columns

Conveyors have so far been shown with columns of constant height, the composite codewords also being of the same constant height. Therefore if the composite codewords are serialised for transmission, the resulting data rate (in bits per second) will be the product of the column height times the rate at which composite codewords are produced, which in turn will typically be equal to a signal sample rate, or a submultiple thereof. If the available transmission rate is not an integer multiple of the composite codeword rate, transmission bandwidth will thereby be wasted.

Figure 15A:
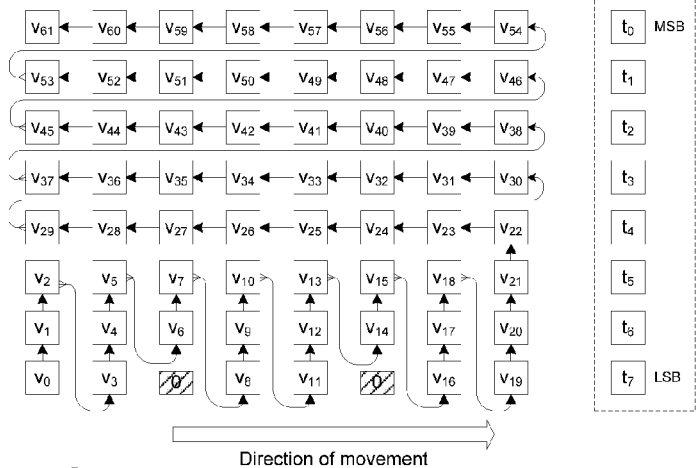
FIGS. 15A, 15B and 15C show a conveyor with columns of unequal height.
Figure 15B:
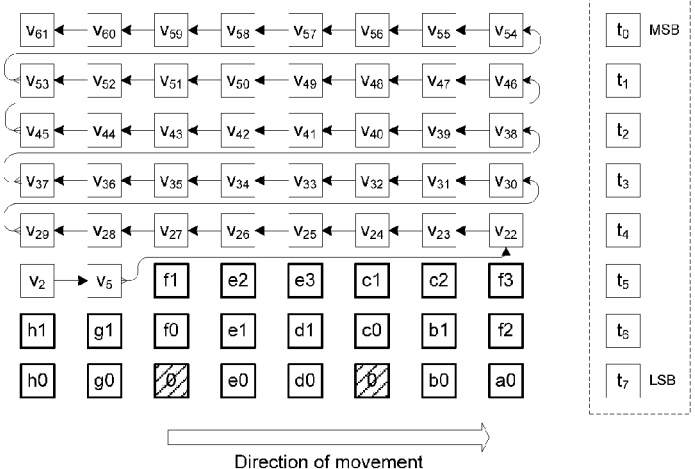
Figure 15C:
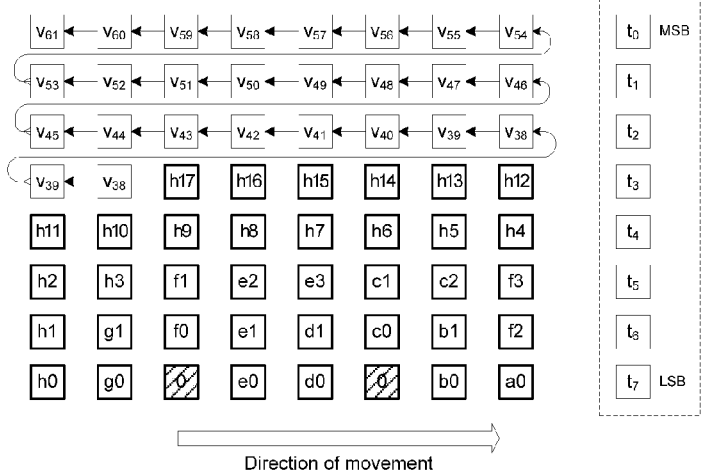

This limitation can be addressed using columns of variable height. One way to do this is to remove from consideration some of the bit positions at the bottom edge of the conveyor, as illustrated in FIG. 15A, which is to be compared with FIG. 14A. In FIG. 15 two bit positions have been excluded from the set of positions available to receive coarse bits. Thus, in FIG. 15B, the coarse bit f0 is placed one bit higher in the column than was the case in FIG. 14B, and there are consequential changes to the allocation of other coarse bits to positions within the conveyor. The exclusion must be performed in a manner that is consistent between the encoder and the decoder, so that the decoder will retrieve bit f0 from the correct position and will also recover other bits correctly, for example using sequence of bit positions $v_i$ that is consistent with that used by the encoder.

When a column containing an excluded bit position reaches the end of the conveyor, the resulting composite codeword can be considered as one bit shorter than previously, and the excluded bit is not transmitted within the stream. If every lowest bit position of the conveyor were thus excluded, the resulting transmitted data rate would be the same as if the height of the conveyor had been reduced by one bit. By excluding a suitable proportion of the lowest bit positions, in a pattern that is known to both the encoder and the decoder, the average transmitted data rate can thus be interpolated between integer multiples of the composite codeword rate, and thereby optimised to make best use of the available transmission rate. It may be necessary to use a small buffer to smooth the uneven number of bits in the composite codewords to a constant bit rate for transmission.

Because an entropy coder will never emit a code of length zero, at least one bit of a composite codeword will normally contain coarse data and thus it is generally pointless to configure a decoder to interpret all the bits as touchup data. In the unlikely event that an excluded bit that has not been transmitted is to be interpreted as touchup, the decoder can substitute a zero bit for $t_7$ in FIG. 15 and a quantiser in the encoder can similarly consider that bit as having been forced to zero.

An alternative use for excluded bit positions is to force them to particular values so that additional low-rate data can be transmitted, for example configuration data describing the stream. In this case the bits are transmitted and the data rate is not reduced.

Division Between Coarse and Fine Data

Figure 17A:
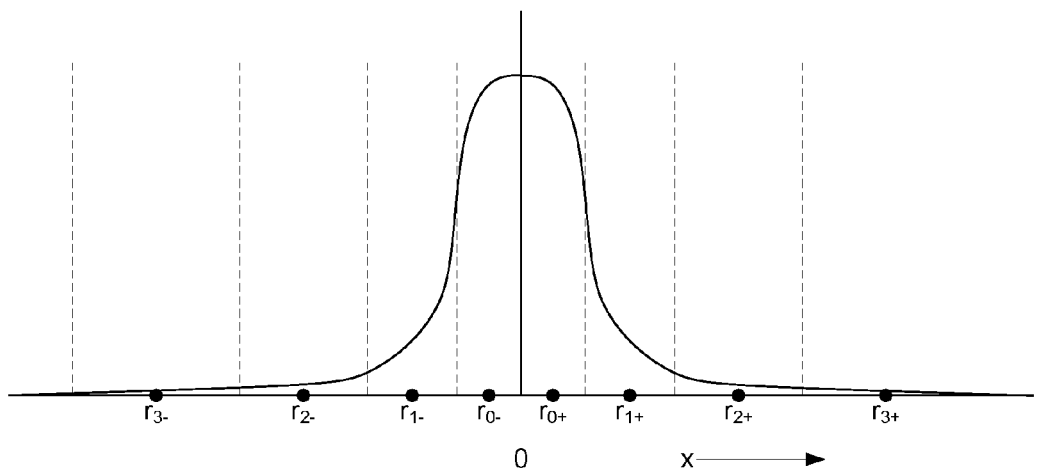
FIGS. 17A, 17B and 17C show an example probability distribution function for a signal and a possible division into eight coarse quantisation regions.

We now consider how a signal variable x may be quantised into coarse and fine bits, taking into account that its Probability Distribution Function (PDF) is unlikely to be constant (rectangular). FIG. 17A shows a typical shape of a signal's PDF, the vertical axis representing the relative frequency with which a signal value x will be encountered. The curve is symmetrical about x=0, as is frequently assumed.

The full range of x-values is shown as divided into eight regions labelled $r_{3-}$, $r_{2-}$, $r_{1-}$, $r_{0-}$, $r_{0+}$, $r_{1+}$, $r_{2+}$, $r_{3+}$. A simple quantiser may identify in which region R a given signal sample x lies by comparing x with the decision thresholds shown as vertical dashed lines. The decision thresholds may be equally spaced or, as illustrated in FIG. 17A, unequally spaced. The result of identifying one of the eight regions is expressed a symbol S which can be entropy coded to furnish "coarse" bits that also identify the region R. The quantiser then uses "fine" bits to describe more accurately where within the region R the sample value x lies.

It is desirable to minimise the average number of coarse bits emitted by the entropy coder in order to leave room within the transmitted data format for a sudden burst caused by a change in signal statistics. This desirability has been noted in connection with organisation of a conveyor, but it applies also to other embodiments of the invention that do not use a conveyor. The number of coarse bits can be reduced by using fewer regions of larger size, signal resolution being restored by using a larger number of fine bits, but the total number of bits may thereby be increased.

For example if regions $r_{0+}$ and $r_{1+}$ in FIG. 17A are coalesced into a single region identified by the coarse bits, then it will require one bit of fine information, which is not entropy coded, in order to specify whether the sample x lies in region $r_{0+}$ or region $r_{1+}$. Whereas if the regions are not coalesced then the choice between region $r_{0+}$ or region $r_{1+}$ will likely require, on average, less than one bit because an entropy coder can take advantage of the substantial difference in the probabilities of the sample x lying in the two regions.

Thus, if there is a substantial variation in PDF over any one region, it will be more efficient overall to subdivide the region. However, this conflicts with the desire to minimise the number of coarse bits. Taking both considerations into account, the division shown in FIG. 17A is probably reasonable for a distribution similar to the one illustrated.

Non-Uniform Quantisation with Touchup

As described earlier, fine and coarse bits are allocated to overlapping regions in the transmitted data. When a coarse bit and a fine bit share the same bit position, the coarse bit, if present, takes priority so that the fine bit that is retrieved by a decoder is forced to take the value that results in correct retrieval of the coarse bit. In a preferred encoder implementation, the values to which fine bits have been forced are notified to the quantiser so that new coarse bits and any other fine bits that are not forced can be chosen in dependence on the forced values. This was illustrated in FIG. 9B, where new coarse bits h0 and h1 and fine bits $t_{h,0}$ and $t_{h,1}$ are chosen in dependence on the forced value a0.

In a preferred decoder implementation, the decoder retrieves fine bits from the received data, without knowledge of whether the fine bits have been forced or not. A sample value is then reconstructed by using entropy-decoded coarse bits to identify the coarse region R in which the sample value x lies, and the fine bits are used to locate more precisely the location of x within R, for example by interpreting the fine bits as a binary fraction between 0 and 1, and mapping from the interval [0, 1] on to R. The mapping can be either linear or nonlinear. If the mapping is linear and the coarse regions are also of uniformly size and spacing ("the linear case"), then this process is equivalent to forming a binary PCM word by concatenating MSBs consisting of the entropy-decoded coarse bits and LSBs consisting of the fine bits, as was illustrated in FIG. 10.

An encoder may assume this preferred decoding model and may proceed as follows. If none of the fine bits is forced, then the encoder identifies the region R in which the sample x lies. If the regions are uniformly spaced, this identification amounts to simple arithmetic quantisation, otherwise a search algorithm may be used. The coarse bits are then set to identify the same region R. The fine bits are set such that, when interpreted as a binary fraction in the decoder, they will map to a value close to the value x. Assuming that the decoder interprets the fine as a binary fraction and maps the interval [0, 1] linearly on to the region R, the choice of fine bits is also achievable by linear arithmetic quantisation.

If all of the fine bits are forced, then the encoder can consider the set of feasible reconstruction points that will result from different choices of the coarse bits. For example, if the assumed mapping from [0, 1] to each coarse region is linear, and if the forced bits are such as to represent the binary fraction 0.5, then the decoder will reconstruct a value at the midpoint of the region specified by the coarse bits. These midpoints are shown as filled circles in FIG. 17A. If the binary fraction is 0.75, then the reconstruction points will all be shifted to the right, each one lying three-quarters of the way along its respective interval. Having established the feasible reconstruction points, the encoder can then decide which one is best to represent the signal. For example it might choose the reconstruction point that is closest to the signal value x. The coarse bits are then chosen to identify the region in which the chosen reconstruction point lies. Note that this region might not be the same as the region that contains the signal value x. For example, if the binary fraction is close to unity, and if the value x lies near the left-hand end of a region, the closest reconstruction point will probably lie in the region that is to the left of the region containing x.

The same principles can be applied in intermediate cases, in which some bits of the touchup word have been forced but there are also some unforced touchup bit positions available for "free" fine bits. Conceptually, the encoder determines, in dependence on the values of the forced bits, an augmented set of reconstruction points, being all the reconstruction points that result from each possible choice of coarse bits and free fine bits. The most suitable reconstruction point is then selected from the augmented set, following which the coarse bits and free fine bits that would result in the decoder's reconstructing that point are then chosen. The skilled person will be able to optimise this conceptual procedure according to the decoding model used, perhaps using a combination of linear arithmetic quantisation and a binary search algorithm, in order to avoid the need for an exhaustive search.

In the linear case, the process described above produces the same result as the subtractive buried data method that has been described with reference to FIG. 11. Whether the quantisation is linear or nonlinear, it is preferred that the coarse bits and/or the fine bits be exclusively-ORed with a pseudorandom sequence before transmission as already described, in order that the statistical properties of the quantisation will not be affected by a systematic pattern in the values of the coarse bits.

In another, less preferred, embodiment, the encoding quantiser is not aware of the forcing of fine bits: it simply chooses the fine bits as if they are not forced, and if coarse bits take priority the chosen fine bits are simply discarded and replaced, as shown in FIG. 9A for the fine bit $t_{h,2}$. The encoder is then simpler than in the preferred embodiment, but the forced fine bits then contribute a noise signal to the decoding. This noise can be reduced in a more complicated decoder that notes which fine bit positions are in fact occupied by coarse bits that it has decoded, and "masks out" these coarse bits when decoding the fine data. The result is however still inferior to that of the preferred embodiment described above, which extends the advantage of "subtractive buried data" to the nonlinear case.

Sign Representation

As noted above, it is desirable to minimise the number of coarse bits, provided that when an increased number of fine bits required to represent the signal to a given resolution is taken into account, the total number of bits is not increased to the point where coding efficiency becomes unacceptable.

Typically a signal PDF is symmetrical, as depicted in FIG. 17, and in this case it is possible to reduce the number of entropy-coded coarse bits by one without sacrificing efficiency. Because of the symmetry, the probability of a sample lying in region $r_{0-}$ is the same as that of its being in region $r_{0+}$, and the same is true of the other pairs of corresponding positive and negative regions. A typical entropy coding method (for example, Huffman coding) will consequently allocate the same number of bits to the two corresponding regions. The total number of bits emitted would be the same if the sign were 'factored out' and sent separately as a sign bit. That is, each pair of corresponding regions is mapped on to the same symbol S, thus halving the number of symbols to be entropy coded and reducing the number of entropy coded bits by one. A sign bit then specifies in which of the two regions of the pair the sample value x lies.

It might be thought that the sign bit cannot be carried in the "touchup" area of the data format, because a sign bit is different from the fine bits, which are considered less important and dispensable in times of stress, whereas a sign bit cannot be forced without introducing gross signal error: for example if the signal sample x is positive but the forced sign bit allows representation of negative values only.

This problem can be solved by modifying a sign-magnitude representation as follows. We will refer to FIG. 17A, and for convenience consider the labels $r_{3-}$, $r_{2-}$, $r_{1-}$, $r_{0-}$, $r_{0+}$, $r_{1+}$, $r_{2+}$, $r_{3+}$ as identifying the reconstruction points marked as filled circles. A conventional sign-magnitude representation encodes positive signal values such as the $r_{0+}r_{1+}$, $r_{2+}$, $r_{3+}$ in FIG. 17A in some suitable manner such as binary PCM, together with a sign bit. The sign bit is interpreted as an instruction to the decoder to invert the sign of the decoded value, conditionally on whether the sign bit is set or not. The modification is to consider the magnitude representation as encoding signal values of increasing magnitude but alternating sign, for example $r_{0+}$, $r_{1-}$, $r_{2+}$, $r_{3-}$. The sign bit retains its meaning of an instruction to perform a conditional negation of the decoded value.

With this modification, the physical encoding of the sign bit now alternates between adjacent reconstruction points, as shown in Table 2:

TABLE 2

| | Reconstruction point | | | | | | | |
|---|---|---|---|---|---|---|---|---|
| | $r_{3-}$ | $r_{2-}$ | $r_{1-}$ | $r_{0-}$ | $r_{0+}$ | $r_{1+}$ | $r_{2+}$ | $r_{3+}$ |
| Sign bit encoding | 0 | 1 | 0 | 1 | 0 | 1 | 0 | 1 |

Figure 17B:
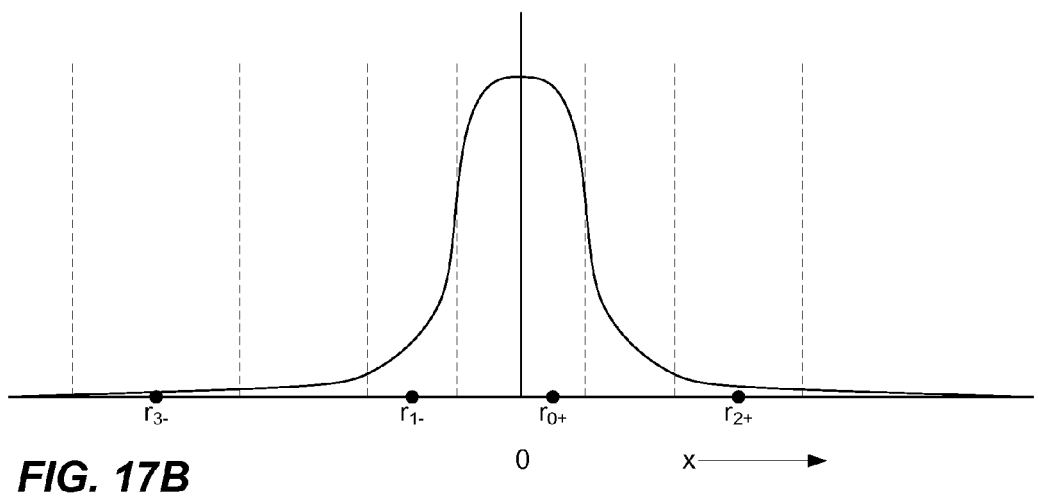
Figure 17C:
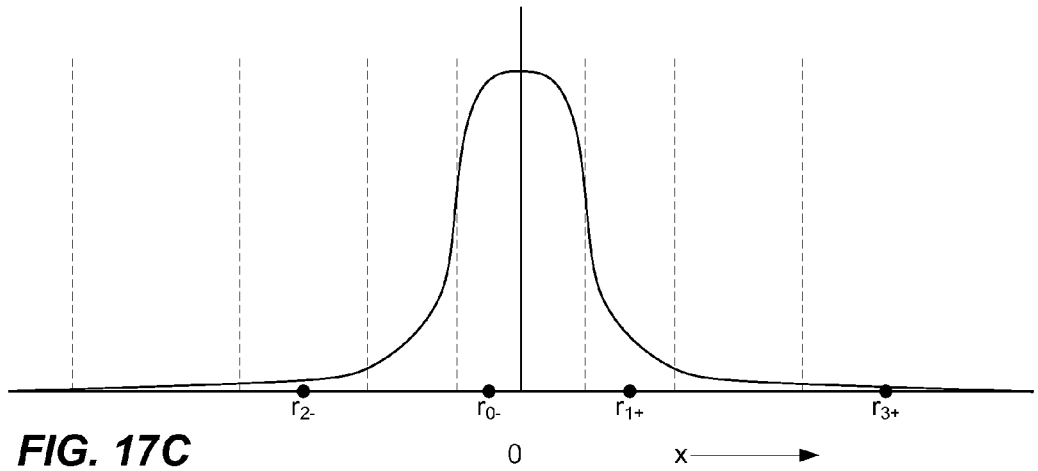

Neither the conventional nor the modified sign bit representation allows the sign bit to be 'flipped' once it has been chosen, without gross modification to the signal. However, if the sign bit must take a particular 'forced' value that is notified to the quantiser, for example by using an architecture similar to that shown in FIG. 9B, the quantiser can achieve the forced sign bit value by choosing between two adjacent reconstruction points. Thus, if the sign bit must be forced to '0' the reconstruction levels available for consideration by the quantiser might be as shown in FIG. 17B, or if the sign bit must be forced to '1', the available levels might be as shown in FIG. 17C. In both cases the encoder then operates as described above for the case where all touchup bits have been forced, constructing the set of available reconstruction points and choosing the most suitable point to represent the signal sample x (for example the nearest reconstruction point to x).

It is preferred that either the sign bit or a coarse bit that may occupy the same bit position within the transmitted data should be exclusively-ORed with a pseudorandom sequence before transmission so that the asymmetric situations depicted in FIG. 17B and in FIG. 17C will occur with equal probability and there will be no systematic bias.

Referring to FIG. 17B and to FIG. 17C, it is clear that if the sign bit has been forced, and if the encoder chooses the nearest reconstruction point to represent the signal value x, then the range of values of x that map on to a given reconstruction point is approximately twice the range that applies when the sign bit has not been forced. As previously recited, there is a loss of coding efficiency when the regions that the quantiser will map to a given symbol become too large. Consequently, efficiency will be sacrificed when the sign bit is forced, but the advantage of the smaller coarse regions in FIG. 17B will be retained when the sign bit is not forced.

In a preferred embodiment, the format of the transmitted data is organised so that, when possible, only low-significance bits of the fine data are forced. Thus, as the number of coarse bits increases, then fine bits of progressively higher significance are forced, with the sign bit being forced as a last resort.

Multidimensional Coding

Multidimensional or vector-valued signals arise in a variety of ways, for example:
A colour video signal, represented for example as (red, green, blue) or as (luminance, chrominance)
Co-temporal samples of a multichannel audio signal
Co-temporal samples from the several bands of a multi-band audio codec, for example FIG. 3
Vectors created by grouping of nearby scalar samples.

An n-dimensional vector can be described by n co-ordinates, and all the above cases the signal can be regarded either as being vector-valued or as comprising several scalar components or co-ordinates. Vector quantisation and coding is well known in the prior art: here we discuss how it affects aspects of the invention such as the organisation of touchup and of a conveyor.

Independent Quantisation

We consider firstly how to apply the invention to cases where the n components or co-ordinates of an n-dimensional vector-valued signal are each separately quantised, resulting in n coarse codewords and n fine codewords for each vector-valued sample. A choice then has to be made as to how the resulting bits are to be merged and allocated to the transmitted data format.

A non-preferred method is to partition the output data format into n separate areas, and replicate the invention as already described n times. For example, the architecture of FIG. 9B may be replicated n times, the resulting composite codewords being multiplexed into the compressed data stream.

Slightly better is to interleave the columns of a conveyor so that they are loaded with coarse bits from the n signal components in rotation. This differs from the simple multiplexing just described in that the conveyor compactifcation method of FIG. 7, or alternatively one of the variants shown in FIG. 12 through FIG. 14, because it now has the freedom to reallocate coarse bits between columns that correspond to different signal components. In the case of a multichannel audio signal, this would be equivalent to interleaving the n scalar channels into a single channel of n times the sample rate, prior to quantisation and coding. It may be noted that the channels or vector components are independently quantised as far as co-temporal samples are concerned but any clipping decisions will be dependent on the history of all channels. If using the architecture of FIG. 9B, the information about forced bits also creates a dependence on the history of other channels.

It is preferred however to use the same number of columns as of vectors, a single column being loaded with all the coarse bits that relate to a vector, and a touchup word similarly containing all the fine bits generated by quantising an n-dimensional vector. There are several ways in which the bits can be organised, one possibility being shown in FIG. 18, which is akin to FIG. 9A, modified to code two signal samples A (100) and B (101). Here the left hand end of the conveyor is loaded with a coarse codeword obtained by jointly coding the two symbols 121, 122 representing coarse information produced by the two quantisers A and B.

The two quantisers also produce the two fine codewords 130 ($A_0, A_1, A_2$) and 131 ($B_0, B_1, B_2$), which are then interleaved bit-wise into a single combined fine codeword ($A_0, B_0, A_1, B_1, A_2, B_2$). The combined fine codeword is then merged with bits from the conveyor to produce a composite codeword 110 that is transmitted to a decoder. At the time-step illustrated, the conveyor contributes the three coarse bits (a0, a1, b6) which take priority over the bottom three bits from the combined fine codeword. For clarity, simple discarding or over-writing of the bottom three bits from the fine codeword has been assumed in FIG. 18, but it will be clear that the interleaved touchup organisation can be applied also in the context of FIG. 9B, using two quantisers each of which is informed which of its fine bits must be forced, and to what values they must be forced.

A variable number of bits emerge from the conveyor, it being assumed as in previous examples that the each column of the conveyor is occupied contiguously from the bottom. The consequent overwriting of touchup in FIG. 18 therefore results in an overwriting of the fine bits from each coder, again from the bottom, as is desired on the assumption that the top bits $A_0$ and $B_0$ are the most significant.

The advantage of bitwise interleaving relates to the inevitable variability in the number of touchup bits that are forced or overwritten. If this number changes by two, then the number of bits from each fine codeword that is overwritten changes by one. Even without reallocation of coarse bits between columns, the variation in column occupancy when the column contains bits from two coded symbols is likely to be less than twice the variation when the column contains bits from just one coded symbol. With compactification or real-location as described, the variation is likely to be reduced even further. It is therefore expected that each fine codeword will see a substantially lower variation in the number of bits that are overwritten or that need to be forced when the fine bits from two or more coded symbols are interleaved in a combined fine codeword.

Interleaving has been shown in the context of an encoder. A corresponding decoder may reassemble received fine codewords from received data having an interleaved data format in a manner that will be obvious. Moreover the precise placement of bits within a transmitted data format can generally be altered without changing the performance, save possibly for overall delay. The word 'interleaved' is here intended to refer to the relationship of the fine bits to the column of a conveyor, and it would be possible to permute the transmitted bits so that fine bits from a particular fine codeword are contiguous. More generally, any invertible transformation can be applied by an encoder and reversed or otherwise taken into account in a decoder.

Figure 18:
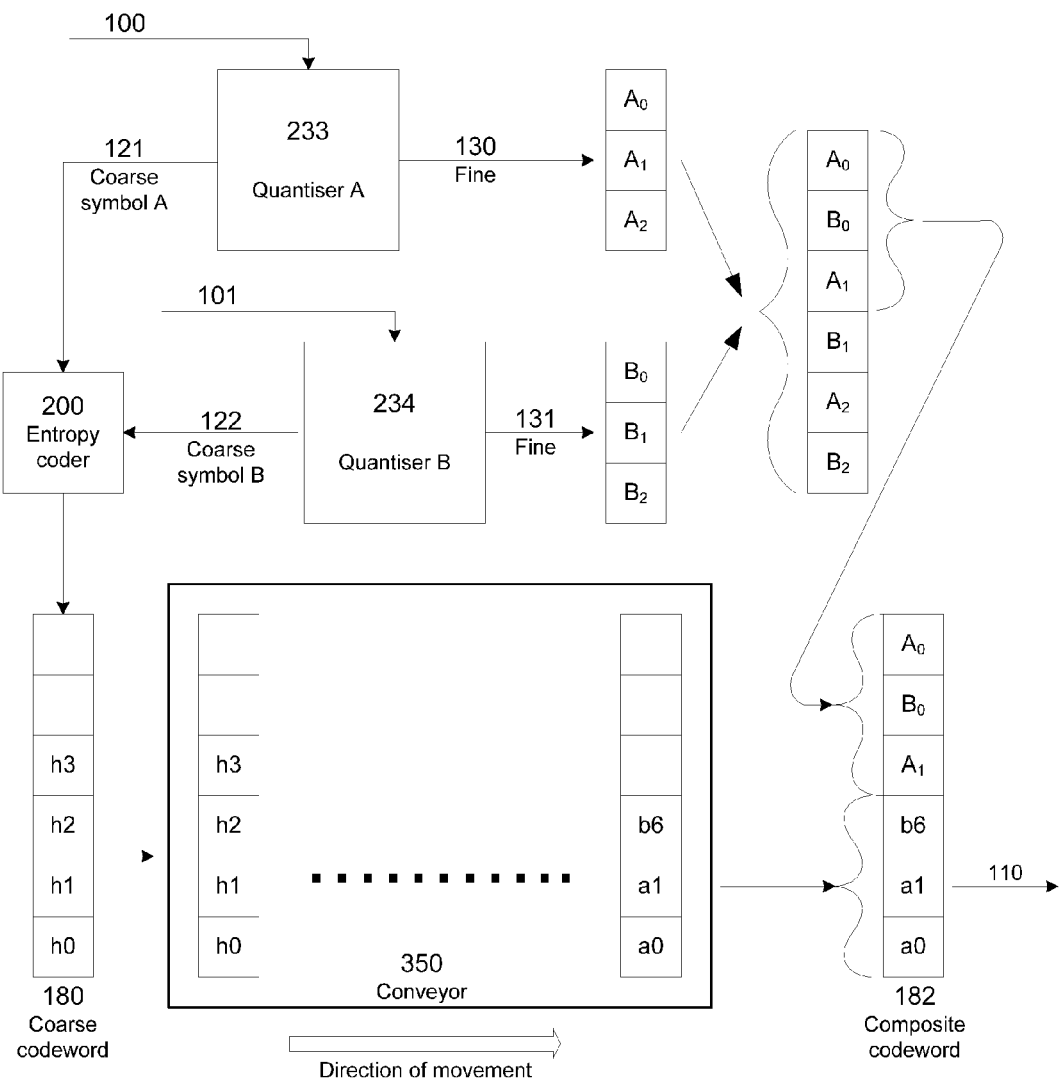
FIG. 18 shows joint coding of signals of coarse symbols from two signals.

Sometimes it is more convenient to code the n coarse symbols separately, and in that case the n individual entropy-coded coarse codewords can be concatenated to form a combined codeword, which is then treated in the same way as the single coarse codeword in FIG. 18.

An alternative to simple concatenation is illustrated in FIG. 19 for the case of three coarse codewords. While the lengths of the coarse codewords are variable, each codeword has a known minimum length, which is a property of the entropy coder used to produce that codeword. For example, the popular Rice code has a minimum length of one bit. In FIG. 19, a number of bits is taken from codeword 3 and placed at the bottom of the combined word, the number being the minimum length of code emitted by the relevant entropy coder. A minimum number of bits is similarly taken from codeword 2 and placed contiguously above the bits from codeword 3. Then all the bits from codeword 1 are placed, followed by the remaining bits from codeword 2 and codeword 3. The result is a combined word that is contiguous but in which each original codeword has a starting position that is fixed relative to the combined word.

If the combining method of FIG. 19 is used in conjunction with the conveyor-based compactification of FIG. 7 then the slots should have a height at least as great as the minimum length of the combined codeword. Similarly, in the hybrid organisation of FIG. 14, the vertically organised zone should preferably be at least as large as the minimum length. Under these conditions, if any of the constituent coarse codewords in FIG. 19 is of minimum length, then the bits of that codeword will be placed entirely in known positions in the data format and its decoding will not be affected except by transmission errors that corrupt those bits directly.

Multidimensional Aspects of an Audio Codec

We now briefly describe ways in which the multidimensional aspects of the invention can be applied to the multiband audio codec of FIG. 3. In a four band encoder, the original full-rate stream 100 of audio samples is split into four bands each at a quarter of the original sampling rate. Four co-temporal samples, one taken from each of the four bands, can be regarded as a four-dimensional vector whose components may be quantised independently and coded either independently or jointly. FIG. 5 assumes independent coding and the "Data formatting" unit 300 therein could contain most of the units shown in FIG. 18 so as to perform the interleaving of the fine codewords, the conveyor actions and the final assembly of a composite codeword. The two-way interleaves shown in FIG. 18 would straightforwardly be replaced by four-way interleaves in a four-band encoder.

Alternatively, the various techniques described here need not necessarily be applied uniformly across all the bands. For example a four-band encoder could quantise and code two bands independently while the other two bands could be separately quantised but jointly coded. There would then be three coarse codewords to be interleaved or otherwise combined.

Another variation relates to the band-splitting structure. Typically a split into four frequency bands is implemented as a split into two sub-bands, using quadrature mirror filters or other methods known in the art, followed by a further, nested, split of each of the two sub-bands. It is alternatively possible to split just one sub-band in order to provide greater frequency resolution and low audio frequencies. In this case there will be three sample streams to quantise, two of them at one-quarter of the original sampling rate, and one at half the original sampling rate. The samples in the half-rate stream may be grouped into consecutive pairs, the pairs being at one quarter of the original sampling rate. Four dimensional vectors at one quarter of the original sampling rate may now be assembled, each comprised of two quarter-rate samples and the two samples of a pair that was grouped from the half-rate stream, and these four-dimensional vectors can then be treated in the same way as outlined above.

An audio codec may require different amplitude resolution in different frequency bands, because of the ear's different sensitivity in the different bands. For example, it may be desired to provide at least two bits more resolution in band A than in band B. Considering FIG. 17, it might be thought natural in quantiser A to divide the range of x into four times as many regions of approximately a quarter the width, thereby requiring two more coarse bits than for quantiser B. Alternatively, the resolution of band A can be increased by giving greater priority to the fine bits of A in the allocation of touchup.

To do this, the strict interleaving of the fine bits shown in the fine combined codeword in FIG. 18 could be preceded by an initial allocation of bits to signal A only, as shown in FIG. 20. Here, if bits are forced from the bottom upwards, up to four bits can be forced while retaining at least two more unforced fine bits allocated to component A than to component B. It is possible that a sudden burst of coarse bits caused by a change in signal statistics might cause five or six bits to be forced, but the consequent sacrifice of A's increased resolution may be considered preferable to the over-full conveyer, requiring clipping, that would be likely to result if A's increased resolution been provided instead by increasing the number of coarse bits emitted by A's entropy coder.

It will be clear that this principle can be extended to other applications having two or more channels that require differing resolutions.

Joint Quantisation with Exclusive-OR Choice

The interleaving of fine bits shown in FIG. 18 is inequitable in that whenever the total number of unforced touchup bits odd, signal A has one more fine bit at the free choice of the quantiser than does signal B.

FIG. 21 shows a touchup allocation scheme that allows this inequality to be avoided. For the sake of illustration, we assume that when no touchup bits are forced, the encoder generates three fine bits ($A_0, A_1, A_2$) from a signal A and three fine bits ($B_0, B_1, B_2$) from signal B. It then encodes these fine bits to six touchup bits ($t_0, t_1, t_2, t_3, t_4, t_5$) according to the equations:

$$t_0 = A_0$$

$$t_1 = A_0 \oplus B_0$$

$$t_2 = A_1$$

$$t_3 = A_1 \oplus B_1$$

$$t_4 = A_2$$

$$t_5 = A_2 \oplus B_2$$

where $\oplus$ denotes addition modulo 2, also known as an exclusive-OR operation.

The touchup bits are then conveyed within the transmitted data to the decoder. The decoder recovers the received fine bits ($A_0^r, A_1^r, A_2^r$) and ($B_0^r, B_1^r, B_2^r$) by inverting the above equations modulo 2. That is:

$$(A_0^r, A_1^r, A_2^r) = (t_0, t_2, t_4)$$

and $$(B_0^r, B_1^r, B_2^r) = (t_0 \oplus t_1, t_2 \oplus t_3, t_4 \oplus t_5)$$

It may be verified that these received fine bits are identical to the original fine bits.

We next consider the situation when an even number of touchup bits is forced, assuming as always that bits are forced starting from the bottom upwards. Inspection of the above equations will show that the constraints are not essentially different from when the simple interleave of FIG. 18 is used. For example, if the touchup bits $t_4$ and $t_5$ are forced to values $F_4$ and $F_5$, then the encoding equations are:

$$t_0 = A_0$$

$$t_1 = A_0 \oplus B_0$$

$$t_2 = A_1$$

$$t_3 = A_1 \oplus B_1$$

$$t_4 = F_4$$

$$t_5 = F_5$$

The decoder is unaware of the forcing, and will apply the same decoding equations as before, to obtain:

$$A_0^r = t_0 = A_0$$

$$A_1^r = t_2 = A_1$$

$$A_2^r = t_4 = F_4$$

$$B_0^r = t_0 \oplus t_1 = A_0 \oplus (A_0 \oplus B_0) = B_0$$

$$B_1^r = t_2 \oplus t_3 = A_1 \oplus (A_1 \oplus B_1) = B_1$$

$$B_2^r = t_4 \oplus t_5 = F_4 \oplus F_5$$

Consequently the encoding quantisers are free to manipulate the values of the received fine bits $A_0^r, A_1^r, B_0^r$ and $B_1^r$ but have no control over the received fine bits $A_2^r$ and $B_2^r$. They should therefore be instructed that bits $A_2$ and $B_2$ must be forced to the values of their received counterparts:

$$A_2 = A_2^r = F_4$$

$$B_2 = B_2^r = F_4 \oplus F_5$$

and should choose $A_0, A_1, B_0$ and $B_1$ accordingly. The encoding equations given above are then applied in order to determine the touchup bits ($t_0, t_1, t_2, t_3, t_4, t_5$).

The division between quantiser bits that are free and those that are forced is the same as was discussed with reference to FIG. 18, and is equitable between the signals A and B.

Finally we consider the forcing of an odd number of touchup bits. For example, suppose that the three touchup bits $t_3$, $t_4$ and $t_5$ are forced to values $F_3, F_4$ and $F_5$ respectively. Inspection of the decoding equations shows that the encoding quantisers have no choice over the received bits $A_2^r$ and $B_2^r$, and are free to choose $A_0^r$, and $B_0^r$, independently of any other choices that might be made. The new consideration is the choice of $A_1^r$, and $B_1^r$, which are not independent in view of the relationship:

$$B_1^r = t_2 \oplus t_3 = A_1^r \oplus F_3$$

which can more conveniently be expressed as the constraint:

$$A_i^r \oplus B_1^r = F_3$$

To respect this constraint, the encoder may proceed as follows. Firstly make the fictitious assumption that only $A_1$ and $B_2$ are forced, to values $F_4$ and $F_4 \oplus F_5$ respectively, and on this basis perform trial quantisations to determine ($A_0, A_1$) and ($B_0, B_1$). Then test whether the resulting $A_1$ and $B_1$ satisfy the constraint $A_1 \oplus B_1 = F_3$. If this constraint is satisfied, then the quantised values ($A_0, A_1$) and ($B_0, B_1$) are accepted and used, together with the forced values $F_4$ and $F_4 \oplus F_5$ for $A_2$ and $B_2$ respectively, in the above encoding equations in order to determine ($t_0, t_1, t_2, t_3, t_4, t_5$).

If the constraint $A_1 \oplus B_1 = F_3$ is not satisfied, then one of the quantisations must be adjusted. A suboptimal way to do this is to choose randomly between signals A and B, and then to requantise that chosen signal with the constraint that bit $A_1$ or bit $B_1$ respectively is forced to be the logical complement ("NOT" or "−") of the value that it had in the trial quantisation. Lower bits such as $A_2$ or $B_2$ continue to be forced to their previous values. Assuming without loss of generality that signal A was chosen, then the requantisation will produce new bits $A_0', A_1'$ and potentially also new coarse bits. By construction, $A_1' = -A_1$, and therefore $A_1' \oplus B_1 = F_3$ and the revised quantisation satisfies the constraint. The touchup bits ($t_0, t_1, t_2, t_3, t_4, t_5$) are now determined from the encoding equations given above but with $A_0'$ and $A_1'$ used in place of $A_0$ and $A_1$.

If signal B was chosen, then B would be requantised in a similar manner and the touchup bits would be determined from the same encoding equations but with new bits $B_0'$ and $B_1'$ used in place of $B_0$ and $B_1$.

It is generally the aim of a quantiser to minimise quantisation error. The effect of forcing a bit is to reduce the options available to the quantiser, and the minimum quantisation error achievable will either increase or stay the same when a bit is forced. Instead of making a random choice between the two signals in the above procedure, it is preferable to guide the choice by evaluating the increase in quantisation error for both choices, and choosing the signal for which the increase is less. In the case of two identical linear quantisers having decision thresholds, this would be equivalent to choosing the signal for which the sample value x is closer to a decision threshold. That in turn would be equivalent to quantising the two signals jointly using a rhombic quantiser (see M. A. Gerzon and P. G. Craven, "A High-Rate Buried-Data Channel for Audio CD", J. Audio Eng. Soc., vol. 43 no. 1/2, 1995 January/February, especially equation 14 with n=2).

Whether the random choice or the guided choice is used, the procedure is equitable between the two signals. When the choice is random, a linear quantiser will suffer a 4 dB increase in noise relative to when the touchup bit $t_3$ is not forced. For the guided choice (rhombic quantiser), the increase is 3 dB, implying that each of the two signals has effectively sacrificed half a bit of resolution in order to accommodate the additional forced bit.

Although exemplified for the forcing of three bits, it will be evident that substantially the same procedure could be used for the forcing of one, three or five bits. Overall, by applying the appropriate procedure described here for an even or an odd number of forced bits, the resolution penalty that results from the forcing can be shared equally between the two signals A and B in all cases. Moreover, the forcing method presented here is compatible with the use of touchup bits to convey the sign of the signal, as was described in relation to FIG. 17, and in a preferred embodiment, the bits $A_0$ and $B_0$ convey the signs of their respective signals.

The methods just described are related to some of the "buried data" methods of described in M. A. Gerzon and P. G. Craven, "A High-Rate Buried-Data Channel for Audio CD", J. Audio Eng. Soc., vol. 43 no. 1/2, 1995 January/February. Section 2.2 of this reference is particularly relevant, describing a method that is closely related to the procedure described above, the forced bits being identified with the "data" of the reference, and the fine bits from signals A and B being identified with the audio bits in the "two stereo channels" referred to in the reference. One difference is that the "$\oplus$" operator is applied between data bits (i.e. to modify one forced value in dependence on another) rather than in encoding and decoding the audio bits representing the two stereo channels (fine bits).

The technique is not limited to operating in two dimensions. For example, a four dimensional coding of the touchup bits might use the following encoding equations for one or more values of n:

$$t_{4n} = A_n$$

$$t_{4n+1} = A_n \oplus B_n$$

$$t_{4n+2} = A_n \oplus C_n$$

$$t_{4n+3} = A_n \oplus B_n \oplus C_n \oplus D_n$$

with corresponding decoding equations:

$$A_n^r = t_{4n}$$

$$B_n^r = t_{4n} \oplus t_{4n+1}$$

$$C_n^r = t_{4n} \oplus t_{4n+2}$$

$$D_n^r = t_{4n} \oplus t_{4n+1} \oplus t_{4n+2} \oplus t_{4n+3}$$

When one or more bits are forced, an encoder may minimise the resulting loss of resolution using principles similar to those described above. An inefficient but feasible means to do this is to select from the $2^4 = 16$ possible combinations of the four touchup bits ($t_{4n}$, $t_{4n+1}$, $t_{4n+2}$, $t_{4n+3}$), those that are consistent with the forcing equations; for each selected combination to apply the decoding equations to determined the received fine bits; to perform a trial quantisation in each case with the fine bits forced to equal the received fine bits so determined; and finally to select the case for which the total quantisation error is least. It can be shown that the four dimensional case illustrated, the resulting loss of resolution will be equitable distributed between all four signals or signal components.

The above 4 dimensional touchup equations can be written in matrix form:

$$\begin{bmatrix} t_{4n} \\ t_{4n+1} \\ t_{4n+2} \\ t_{4n+3} \end{bmatrix} = T \cdot \begin{bmatrix} A_n \\ B_n \\ C_n \\ D_n \end{bmatrix} \text{ where } T = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

and $$\begin{bmatrix} A_n^r \\ B_n^r \\ C_n^r \\ D_n^r \end{bmatrix} = T^{-1} \cdot \begin{bmatrix} t_{4n} \\ t_{4n+1} \\ t_{4n+2} \\ t_{4n+3} \end{bmatrix} \text{ where } T^{-1} = \begin{bmatrix} 1 & 0 & 0 & 0 \\ 1 & 1 & 0 & 0 \\ 1 & 0 & 1 & 0 \\ 1 & 1 & 1 & 1 \end{bmatrix}$$

where the matrix multiplications are over $Z_2$, the field of integers modulo 2.

The above equations are intended merely to indicate possibilities. As presented, they relate to the treatment of bit n from the fine codeword of each of four signal components. Clearly the equations can be "stacked", for example to provide encoding equations for four touchup bits relating to bit n of each of four fine codewords, and for four further touchup bits relating to bit n+1 of each of the four fine codewords. If some codewords require less ultimate resolution than others, there is no need to maintain four dimensions for the less significant bits, and one could then use matrices of lower dimensionality such as:

$$\begin{bmatrix} 1 & 0 & 0 \\ 1 & 1 & 0 \\ 1 & 1 & 1 \end{bmatrix} \text{ (three dimensions) or}$$

$$\begin{bmatrix} 1 & 0 \\ 1 & 1 \end{bmatrix} \text{ (two dimensions).}$$

It will be appreciated that the equations given previously for the treatment of three fine bits from each of two signals A and B are stacked equations derived from three instances of the above two-dimensional matrix. More generally however it is not essential to restrict to stacking of sets of equations, each set involving only a single fine bit from each component. Encoding equations can be constructed using almost any invertible matrix T. A designer may evaluate, for each number of touchup bits that might be forced, how the inevitable loss of signal resolution is distributed between signal components, and choose the matrix that is considered to give the most acceptable result overall.

The invention claimed is:

1. A method, executed by a system to process a sequence of signal samples and to furnish a sequence of composite codewords containing bits, the method comprising:
maintaining a conveyor comprising a sequence of slots, including a start slot and an end slot, wherein each slot is adapted to contain one or more bits and wherein the conveyor is adapted to effectively move the bit content of each slot to an adjacent slot after the passage of a time step, whereby bits are conveyed from earlier slots to later slots with the passage of each subsequent time step; and, for each signal sample performing the steps of:
representing the signal sample by a coarse codeword and a touchup codeword, each of the coarse codeword and touchup codeword containing bits;
distributing the bits of the coarse codeword into slots in the conveyor;
retrieving a delayed codeword from the end slot; and,
combining the touchup codeword with the delayed codeword to furnish a composite codeword.

2. A method according to claim 1, wherein the step of representing comprises the steps of:
quantising the signal sample to furnish a PCM binary word;
dividing the PCM binary word into MSBs and LSBs;
generating a touchup codeword in dependence on the LSBs; and,
coding the MSBs to furnish a coarse codeword of signal-dependent length.

3. A method according to claim 1, wherein the step of representing comprises the steps of:
quantising the signal sample to furnish a symbol, a sign bit and a fine codeword;
generating a touchup codeword in dependence on the sign bit and on the fine codeword; and, coding the symbol to furnish a coarse codeword of signal-dependent length.

4. A method according to claim 1, wherein the step of distributing comprises the steps of:
placing a bit of the coarse codeword into the first slot;
moving a bit from an earlier slot within the conveyor to a later slot containing at least two fewer bits, conditionally on the slot containing more than a predetermined number of bits.

5. A method according to claim 1, wherein the step of representing comprises quantising in dependence on the values of bits in the delayed codeword.

6. A method according to claim 1, comprising the further steps of:
deriving an arithmetic value in dependence on the values of bits in the delayed codeword; and,
subtracting the arithmetic value from the signal sample, wherein the step of subtracting is performed prior to the step of quantising.

7. A method according to claim 1, wherein the sample is vector-valued and wherein the step of representing comprises:
quantising a first and a second component of the sample to furnish a first fine codeword and a second fine codeword both containing bits; and,
forming an exclusive-OR combination of a bit from the first fine codeword and a bit from the second fine codeword to furnish a touchup codeword.

8. A method according to claim 1, further comprising the step of:
placing a void bit into a slot prior to the step of distributing, wherein the step of combining the touchup word with the delayed codeword further comprises the step of:
detecting the presence of a void bit in the delayed codeword; and,
reducing the length of the composite codeword in response to the presence of the void bit.

9. A method according to claim 8, wherein the step of placing a void bit is carried out in respect of a proportion of the signal samples according to a predetermined pattern.

10. A method, executed by a system to process a sequence of composite codewords containing bits and to furnish a sequence of signal samples, the method comprising the steps of:
placing bits from the composite codeword into a LIFO (last in first out) stack;
placing bits from a replica of the composite codeword into a delay unit;
retrieving first bits from the LIFO stack, the number of first bits retrieved being determined in dependence on the values of those bits already retrieved;
retrieving delayed bits from the delay unit; and,
jointly decoding the first bits and the delayed bits to furnish a signal sample.

11. A method according to claim 10, wherein the step of jointly decoding comprises the steps of:
decoding the first bits to furnish a first arithmetic value;
deriving a second arithmetic value from the delayed bits; and,
adding the first arithmetic value to the second arithmetic value.

12. A method according to claim 11, wherein the step of jointly decoding comprises the step of conditionally negating the first arithmetic value, the condition being determined in dependence on a delayed bit.

13. A method according to claim 11, wherein the step of deriving comprises performing an exclusive-OR operation between a first delayed bit and a second delayed bit.

14. A method, executed by a system to process a signal and to furnish a formatted binary representation, the method comprising the steps of:
deriving from the signal a first set and a second set of codewords, referred to as "coarse codewords" and "touchup codewords" respectively, each codeword comprising bits;
establishing, in relation to each touchup codeword, a set of predetermined touchup bit positions within the formatted binary representation, the touchup bit positions being predetermined independently of the length of any codeword or of data contained within any codeword;
unconditionally placing the bits of a coarse codeword into the formatted binary representation; and,
conditionally placing a bit from a touchup codeword into the predetermined touchup bit position that was established in relation to that touchup codeword, wherein:
the coarse codewords have a signal-dependent length; and,
the placement of each bit from a touchup codeword into its respective predetermined touchup bit position is conditional on that position not being occupied by a bit from a coarse codeword.

15. A method according to claim 14, wherein:
the signal contains samples;
each coarse codeword is derived from a group of one or more of the signal samples, the groups being disjoint;
for each such coarse codeword there is a corresponding touchup codeword that is derived from the same group of samples; and,
a bit from a coarse codeword is placed in a predetermined touchup bit position that has been established in relation to a touchup word that does not correspond to the coarse codeword.

16. A method according to claim 15, wherein the codewords are ordered in time, and wherein no bit from any coarse codeword is placed in a touchup bit position that has been established in relation to a touchup word that corresponds to a previous coarse codeword.

17. A method according to claim 14, wherein, in the unconditional placement step, a bit from a first coarse codeword is placed at a position that is dependent on the length of a second coarse codeword.

18. A method according to claim 14, wherein the bits of the coarse codewords are placed according to a method known as Error Resilient Entropy Coding (or EREC).

19. A method according to claim 14, wherein the signal comprises samples ordered in time and wherein the time delay before which an encoded signal can be decoded does not exceed n sample periods, where preferably n=32, more preferably n=20, still more preferably n=12, and most preferably n=8.

20. A method according to claim 14, wherein the step of deriving further comprises the step of quantising portions of the signal, wherein the codewords are derived in dependence on the quantised signal portions, and wherein a step of quantising is performed in dependence on the value of a bit from a coarse codeword that has been placed in a touchup bit position corresponding to a touchup codeword that will be derived in dependence on the step of quantising.

21. A method according to claim 14, wherein the bits within a touchup codeword have differing significance and wherein bits from the coarse codewords are preferentially placed in positions other than predetermined touchup bit positions that, if not occupied by a bit from a coarse codeword, would be used to place touchup bits of high significance.

22. A method according to claim 14, where the system is an Adaptive Differential Pulse Code Modulation (ADPCM) encoder.

23. A codec comprising a system according to claim 14 in combination with a decoder adapted to decode a signal.

24. A data carrier comprising signal encoded using the method of claim 14.

25. A method, executed by a system to process formatted binary data representing a signal, comprising the steps of:
retrieving from the data a first set of codewords containing bits, referred to as "coarse codewords";
retrieving from the data a second set of codewords containing bits, referred to as "touchup codewords"; and,
combining the coarse codewords and the touchup codewords to furnish an output signal,
wherein the length of a coarse codeword is determined in dependence on the values of bits in the codeword,
wherein the step of retrieving a touchup codeword comprises the steps of:
establishing, in relation to each bit of the touchup codeword, a predetermined touchup bit position within the formatted binary data, the touchup bit position having been predetermined independently of the length of any retrieved coarse codeword or of data contained within any retrieved coarse codeword; and,
conditionally retrieving each bit of the touchup codeword from its predetermined touchup bit position, and
wherein a bit of a coarse codeword is retrieved from a bit position that is also a predetermined bit position established in relation to a bit of a touchup codeword.

26. A method according to claim 25 wherein, at least one bit from each coarse codeword is retrieved from a predetermined position within the data.

27. A method according to claim 25, wherein a bit of a first coarse codeword is retrieved from a position within the data that is determined in dependence on the length of a second coarse codeword.

28. A method according to claim 25, wherein, in the step of conditionally retrieving a bit of a touchup codeword, the condition is always true, and wherein the step of combining a touchup codeword is performed independently of whether any bit from a coarse codeword has been retrieved from a bit position that has been established as the predetermined bit position relating to the bit of the touchup codeword.

29. A method according to claim 25, wherein the system is an Adaptive Differential Pulse Code Modulation (ADPCM) decoder.

30. A method, executed by a system to process a sequence of input codewords of varying length and to furnish a sequence of compactified codewords, the method comprising,
maintaining a conveyor comprising a sequence of slots, including a start slot and an end slot, wherein each slot is adapted to contain one or more bits and wherein the conveyor is adapted to effectively move the bit content of each slot to an adjacent slot after the passage of a time step, whereby bits are conveyed from earlier slots to later slots with the passage of each subsequent time step; and,
for each input codeword performing the steps of:
placing the input codeword into the start slot;
moving a bit from an earlier slot within the conveyor to a later slot having at least two fewer bits; and,
retrieving a compactified codeword from the end slot.

31. A method according to claim 30 wherein the step of moving comprises:
determining whether the start slot contains more than a predetermined number of bits, and whether there exists a later slot in the conveyor containing the fewer than the predetermined number of bits; and,
conditionally on the said determination, moving a bit from the start slot to the first of any such later slots.

* * * * *

UNITED STATES PATENT AND TRADEMARK OFFICE
CERTIFICATE OF CORRECTION

PATENT NO. : 8,533,571 B2  
APPLICATION NO. : 13/122202  
DATED : September 10, 2013  
INVENTOR(S) : Peter Graham Craven and Malcolm Law Page 1 of 1

It is certified that error appears in the above-identified patent and that said Letters Patent is hereby corrected as shown below:

On the Title Page

Item (76) Inventors:  
First named inventor should read as: "Peter Graham Craven, Surrey (UK)"  
Second named inventor should read as: "Malcolm Law, West Sussex (UK)"

Signed and Sealed this  
Thirteenth Day of August, 2019

Andrei Iancu  
*Director of the United States Patent and Trademark Office*